United States Patent
Huang et al.

(10) Patent No.: US 12,274,125 B2
(45) Date of Patent: Apr. 8, 2025

(54) COLOR CONVERSION DISPLAY WITH POLARIZED EMISSION ENHANCEMENT

(71) Applicant: Meta Platforms Technologies, LLC, Menlo Park, CA (US)

(72) Inventors: Yuge Huang, Oviedo, FL (US); Lu Lu, Kirkland, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 537 days.

(21) Appl. No.: 17/680,272

(22) Filed: Feb. 24, 2022

(65) Prior Publication Data
US 2022/0367839 A1 Nov. 17, 2022

Related U.S. Application Data

(60) Provisional application No. 63/189,487, filed on May 17, 2021.

(51) Int. Cl.
*H10K 50/86* (2023.01)
*G02B 5/30* (2006.01)
*H10K 59/38* (2023.01)

(52) U.S. Cl.
CPC ........... *H10K 50/86* (2023.02); *G02B 5/3075* (2013.01); *H10K 59/38* (2023.02)

(58) Field of Classification Search
CPC ........ H10K 50/86; H10K 59/38; H10K 59/35; H10K 59/8791; G02B 5/3075; G02B 5/208; G02B 5/22; G02B 2027/0118; G02B 2027/0178; G02B 27/286; G02B 27/0172
See application file for complete search history.

(56) References Cited

U.S. PATENT DOCUMENTS

| | | | |
|---|---|---|---|
| 10,018,871 B1 * | 7/2018 | Song | C09K 11/06 |
| 2005/0035353 A1 | 2/2005 | Adachi et al. | |
| 2011/0216271 A1 * | 9/2011 | Suzuki | G02F 1/13362 349/71 |
| 2016/0085102 A1 * | 3/2016 | Ohmuro | G02B 5/305 362/19 |

(Continued)

FOREIGN PATENT DOCUMENTS

EP 3188242 A1 7/2017

OTHER PUBLICATIONS

International Preliminary Report on Patentability for International Application No. PCT/US2022/029350, mailed Nov. 30, 2023, 10 pages.

(Continued)

*Primary Examiner* — Amar Movva
*Assistant Examiner* — Sandra Milena Rodriguez Villan
(74) *Attorney, Agent, or Firm* — MILLBURN IP PLLC

(57) ABSTRACT

A display is provided. The display includes a plurality of light-emitting elements configured to emit a first light associated with a first predetermined wavelength band. The display also includes an optical assembly including a reflective polarizer, a color conversion layer, and a color filter layer. The optical assembly is configured to at least partially convert the first light associated with the first predetermined wavelength band into a second light associated with a second predetermined wavelength band, the second light being a polarized light of a predetermined polarization.

19 Claims, 19 Drawing Sheets

(56) References Cited

U.S. PATENT DOCUMENTS

2017/0343853 A1 11/2017 Lee et al.
2019/0204672 A1 7/2019 Choi et al.

OTHER PUBLICATIONS

Hadar I., et al., "Polarization Properties of Semiconductor Nanorod Heterostructures: From single Particles to the Ensemble," Journal of Physical Chemistry Letters, Jan. 19, 2013, vol. 4, pp. 502-507, 16 pages.
Srivastava A.K., et al., "Luminescent Down-Conversion Semiconductor Quantum Dots and Aligned Quantum Rods for Liquid Crystal Displays," Advanced Science, 2019, vol. 6, 1901345, 20 pages.
Zhu R., et al., "Functional Reflective Polarizer for Augmented Reality and Color Vision Deficiency," Optics Express, Mar. 7, 2016, vol. 24, No. 5, pp. 5431-5441, 11 pages.
International Search Report and Written Opinion for International Application No. PCT/US2022/029350 mailed Sep. 16, 2022, 13 pages.

\* cited by examiner

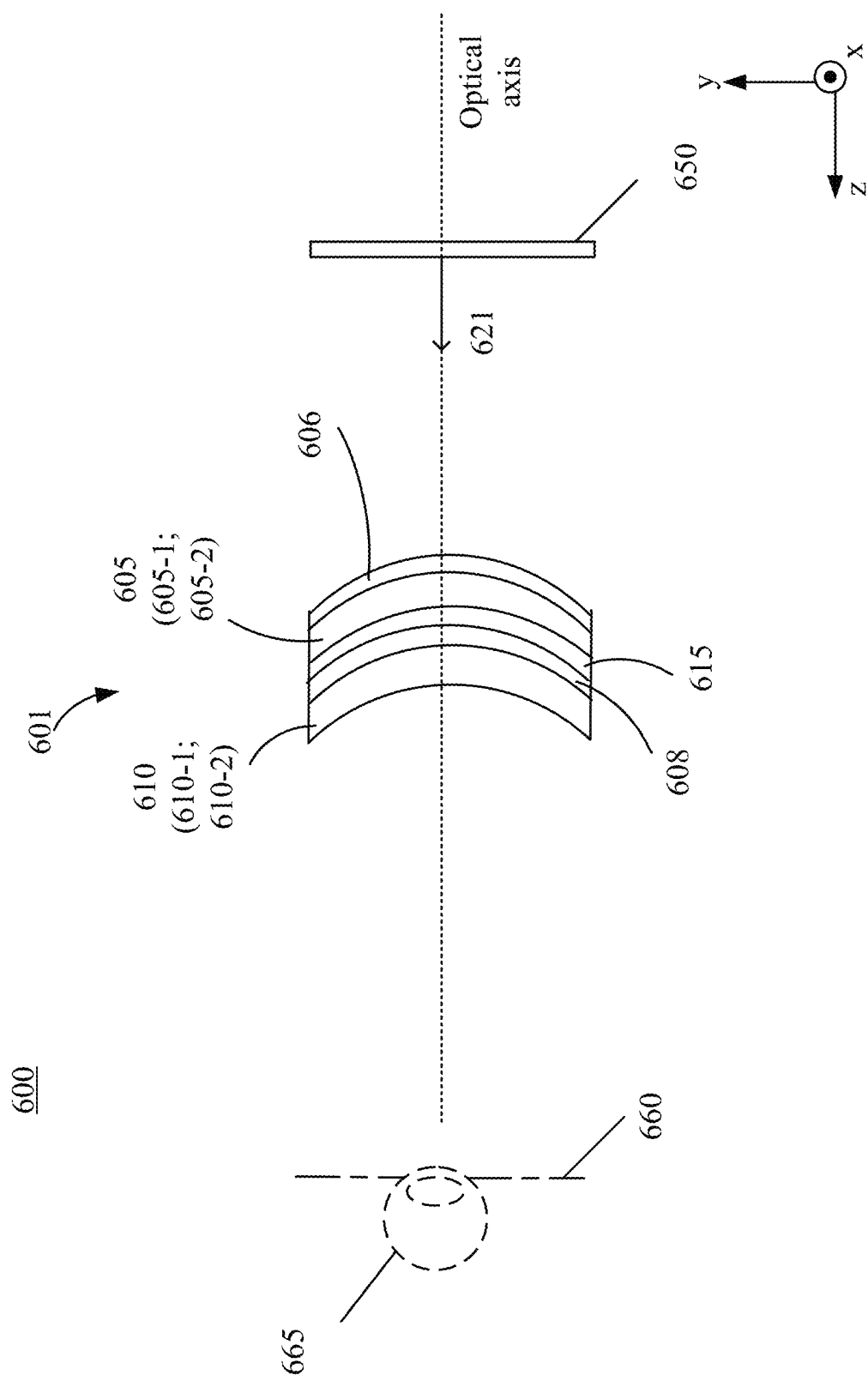

COLOR CONVERSION DISPLAY WITH POLARIZED EMISSION ENHANCEMENT

CROSS REFERENCE TO RELATED APPLICATION

This application claims the benefit of priority to U.S. Provisional Application No. 63/189,487, filed on May 17, 2021. The content of the above-mentioned application is incorporated herein by reference in its entirety.

TECHNICAL FIELD

The present disclosure relates generally to optical devices and, more specifically, to a color conversion display with polarized emission enhancement.

BACKGROUND

Display technologies have been widely used in a large variety of applications in daily life, such as smartphones, tablets, laptops, monitors, TVs, projectors, vehicles, virtual reality ("VR") devices, augmented reality ("AR") devices, mixed reality ("Mg") devices, etc. Non-emissive displays, such as liquid crystal displays ("LCDs"), liquid-crystal-on-silicon ("LCoS") displays, or digital light processing ("DLP") displays, may require a backlight unit to illuminate a display panel. LCDs are attractive candidates for transparent displays and high luminance displays. Self-emissive displays may display images through emitting lights with different intensities and colors from light-emitting elements. Self-emissive displays may also function as a locally dimmable backlight unit for LCDs having a highly dynamic range. Self-emissive displays, such as organic light-emitting diode ("OLED") displays, have been rapidly developed and implemented in the past few years. An OLED display can provide a high power efficiency, a superior dark state, a thin thickness, and a freeform factor, and has been widely used in TVs and smart phones. Emerging self-emissive displays, such as micro organic light-emitting diode ("micro-OLED") displays, micro light-emitting diode ("micro-LED") displays, mini-LED displays, are promising technologies for next-generation displays. These displays offer ultra-high luminance and long lifetimes, which are highly desirable for sunlight readable displays, such as smart phone displays, public information displays, and vehicle displays.

SUMMARY OF THE DISCLOSURE

Consistent with an aspect of the present disclosure, a display is provided. The display includes a plurality of light-emitting elements configured to emit a first light associated with a first predetermined wavelength band. The display also includes an optical assembly including a reflective polarizer, a color conversion layer, and a color filter layer. The optical assembly is configured to at least partially convert the first light associated with the first predetermined wavelength band into a second light associated with a second predetermined wavelength band, the second light being a polarized light of a predetermined polarization.

Other aspects of the present disclosure can be understood by those skilled in the art in light of the description, the claims, and the drawings of the present disclosure.

BRIEF DESCRIPTION OF THE DRAWINGS

The following drawings are provided for illustrative purposes according to various disclosed embodiments and are not intended to limit the scope of the present disclosure. In the drawings:

FIG. 6A schematically illustrates a diagram of an optical system, according to an embodiment of the present disclosure;

DETAILED DESCRIPTION

Figure 1A:
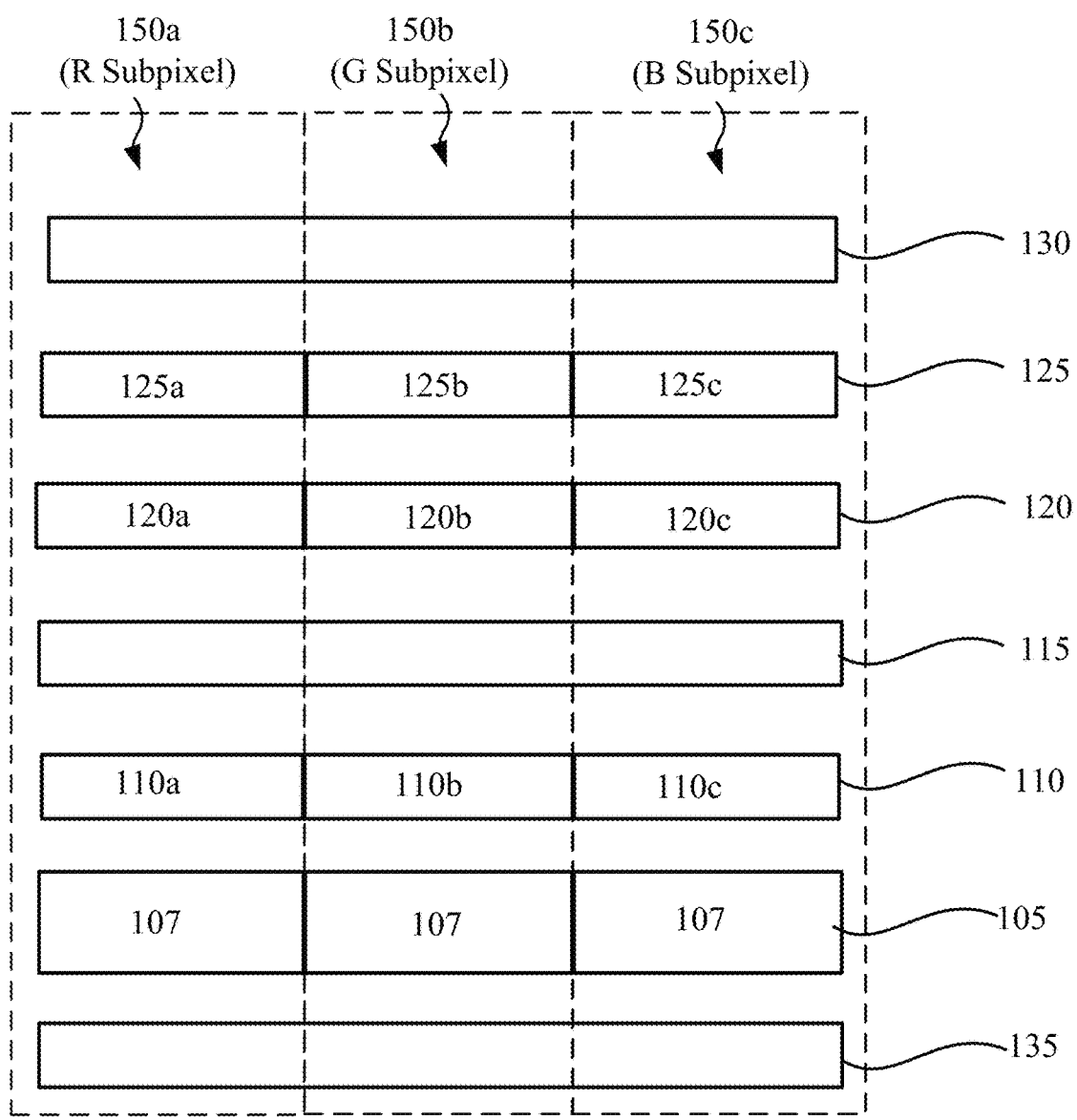
FIG. 1A schematically illustrates a display device, according to an embodiment of the present disclosure.

Embodiments consistent with the present disclosure will be described with reference to the accompanying drawings, which are merely examples for illustrative purposes and are not intended to limit the scope of the present disclosure. Wherever possible, the same reference numbers are used throughout the drawings to refer to the same or similar parts, and a detailed description thereof may be omitted.

Further, in the present disclosure, the disclosed embodiments and the features of the disclosed embodiments may be combined. The described embodiments are some but not all of the embodiments of the present disclosure. Based on the disclosed embodiments, persons of ordinary skill in the art may derive other embodiments consistent with the present disclosure. For example, modifications, adaptations, substitutions, additions, or other variations may be made based on the disclosed embodiments. Such variations of the disclosed embodiments are still within the scope of the present disclosure. Accordingly, the present disclosure is not limited to the disclosed embodiments. Instead, the scope of the present disclosure is defined by the appended claims.

As used herein, the terms "couple," "coupled," "coupling," or the like may encompass an optical coupling, a mechanical coupling, an electrical coupling, an electromagnetic coupling, or any combination thereof. An "optical coupling" between two optical elements refers to a configuration in which the two optical elements are arranged in an optical series, and a light output from one optical element may be directly or indirectly received by the other optical element. An optical series refers to optical positioning of a plurality of optical elements in a light path, such that a light output from one optical element may be transmitted, reflected, diffracted, converted, modified, or otherwise processed or manipulated by one or more of other optical elements. In some embodiments, the sequence in which the plurality of optical elements are arranged may or may not affect an overall output of the plurality of optical elements. A coupling may be a direct coupling or an indirect coupling (e.g., coupling through an intermediate element).

The phrase "at least one of A or B" may encompass all combinations of A and B, such as A only, B only, or A and B. Likewise, the phrase "at least one of A, B, or C" may encompass all combinations of A, B, and C, such as A only, B only, C only, A and B, A and C, B and C, or A and B and C. The phrase "A and/or B" may be interpreted in a manner similar to that of the phrase "at least one of A or B." For example, the phrase "A and/or B" may encompass all combinations of A and B, such as A only, B only, or A and B. Likewise, the phrase "A, B, and/or C" has a meaning similar to that of the phrase "at least one of A, B, or C." For example, the phrase "A, B, and/or C" may encompass all combinations of A, B, and C, such as A only, B only, C only, A and B, A and C, B and C, or A and B and C.

When a first element is described as "attached," "provided," "formed," "affixed," "mounted," "secured," "connected," "bonded," "recorded," or "disposed," to, on, at, or at least partially in a second element, the first element may be "attached," "provided," "formed," "affixed," "mounted," "secured," "connected," "bonded," "recorded," or "disposed," to, on, at, or at least partially in the second element using any suitable mechanical or non-mechanical manner, such as depositing, coating, etching, bonding, gluing, screwing, press-fitting, snap-fitting, clamping, etc. In addition, the first element may be in direct contact with the second element, or there may be an intermediate element between the first element and the second element. The first element may be disposed at any suitable side of the second element, such as left, right, front, back, top, or bottom.

When the first element is shown or described as being disposed or arranged "on" the second element, term "on" is merely used to indicate an example relative orientation between the first element and the second element. The description may be based on a reference coordinate system shown in a figure, or may be based on a current view or example configuration shown in a figure. For example, when a view shown in a figure is described, the first element may be described as being disposed "on" the second element. It is understood that the term "on" may not necessarily imply that the first element is over the second element in the vertical, gravitational direction. For example, when the assembly of the first element and the second element is turned 180 degrees, the first element may be "under" the second element (or the second element may be "on" the first element). Thus, it is understood that when a figure shows that the first element is "on" the second element, the configuration is merely an illustrative example. The first element may be disposed or arranged at any suitable orientation relative to the second element (e.g., over or above the second element, below or under the second element, left to the second element, right to the second element, behind the second element, in front of the second element, etc.).

When the first element is described as being disposed "on" the second element, the first element may be directly or indirectly disposed on the second element. The first element being directly disposed on the second element indicates that no additional element is disposed between the first element and the second element. The first element being indirectly disposed on the second element indicates that one or more additional elements are disposed between the first element and the second element.

The term "processor" used herein may encompass any suitable processor, such as a central processing unit ("CPU"), a graphics processing unit ("GPU"), an application-specific integrated circuit ("ASIC"), a programmable logic device ("PLD"), or any combination thereof. Other processors not listed above may also be used. A processor may be implemented as software, hardware, firmware, or any combination thereof.

The term "controller" may encompass any suitable electrical circuit, software, or processor configured to generate a control signal for controlling a device, a circuit, an optical element, etc. A "controller" may be implemented as software, hardware, firmware, or any combination thereof. For example, a controller may include a processor, or may be included as a part of a processor.

The term "non-transitory computer-readable medium" may encompass any suitable medium for storing, transferring, communicating, broadcasting, or transmitting data, signal, or information. For example, the non-transitory computer-readable medium may include a memory, a hard disk, a magnetic disk, an optical disk, a tape, etc. The memory may include a read-only memory ("ROM"), a random-access memory ("RAM"), a flash memory, etc.

The term "film," "layer," "coating," or "plate" may include rigid or flexible, self-supporting or free-standing film, layer, coating, or plate, which may be disposed on a supporting substrate or between substrates. The terms "film," "layer," "coating," and "plate" may be interchangeable.

The phrases "in-plane direction," "in-plane orientation," "in-plane rotation," "in-plane alignment pattern," and "in-plane pitch" refer to a direction, an orientation, a rotation, an alignment pattern, and a pitch in a plane of a film or a layer (e.g., a surface plane of the film or layer, or a plane parallel to the surface plane of the film or layer), respectively. The term "out-of-plane direction" or "out-of-plane orientation" indicates a direction or orientation that is non-parallel to the plane of the film or layer (e.g., perpendicular to the surface plane of the film or layer, e.g., perpendicular to a plane parallel to the surface plane). For example, when an "in-plane" direction or orientation refers to a direction or orientation within a surface plane, an "out-of-plane" direction or orientation may refer to a thickness direction or orientation perpendicular to the surface plane, or a direction or orientation that is not parallel with the surface plane.

The term "orthogonal" as used in "orthogonal polarizations" or the term "orthogonally" as used in "orthogonally polarized" means that an inner product of two vectors representing the two polarizations is substantially zero. For example, two lights with orthogonal polarizations or two orthogonally polarized lights may be two linearly polarized lights with polarizations in two orthogonal directions (e.g., an x-axis direction and a y-axis direction in a Cartesian coordinate system) or two circularly polarized lights with opposite handednesses (e.g., a left-handed circularly polarized light and a right-handed circularly polarized light).

The term "substantially" or "primarily" used to modify an optical response action, such as transmit, reflect, diffract, block or the like that describes processing of a light means that a majority portion, including all, of a light is transmitted, reflected, diffracted, or blocked, etc. The majority portion may be a predetermined percentage (greater than 50%) of the entire light, such as 100%, 95%, 90%, 85%, 80%, etc., which may be determined based on specific application needs.

Conventional LCD displays have a limited power efficiency, as polarizers and color filters block more than 70% of the backlight. Conventional OLED displays may be more energy efficient than LCD displays. An OLED display may include an OLED panel and a circular absorptive polarizer laminated with the OLED panel. The circular absorptive polarizer is configured to block a reflected ambient light from bottom reflective electrodes of OLEDs via absorption, thereby increasing the contrast ratio of the OLED display. However, the circular polarizer may also absorb about half of the light emitted from the OLEDs, resulting in at least 50% efficiency loss. A circular reflective polarizer may replace the circular absorptive polarizer to improve the power efficiency of the OLED display. However, the circular reflective polarizer also reflects at least half of the ambient light falling on the display, resulting in ghost images and low contrast ratio when the ambient light is strong. Displays of high power efficiency, high contrast ratio, and high image quality are desirable in various applications.

In view of the limitations of the conventional technologies, the present disclosure provides various display devices or displays with enhanced light transmittance and reduced surface reflection. In some embodiments, the present disclosure provides a display including a plurality of light-emitting elements configured to emit a first light associated with a first predetermined wavelength band. The display may also include an optical assembly including a reflective polarizer, a color conversion layer, and a color filter layer. The optical assembly may be configured to at least partially convert the first light associated with the first predetermined wavelength band into a second light associated with a second predetermined wavelength band, the second light being a polarized light of a predetermined polarization.

In some embodiments, the reflective polarizer may be configured to selectively reflect or transmit a light depending on a polarization of the light when the light is associated with the first predetermined wavelength band, and transmit the light independent of the polarization of the light when the light is associated with a wavelength band outside of the first predetermined wavelength band. In some embodiments, the color conversion layer may be configured to substantially maintain a polarization of a light while converting the light from being associated with the first predetermined wavelength band to being associated with the second predetermined wavelength band.

In some embodiments, the color conversion layer may include an anisotropic material aligned in a predetermined direction. For example, the color conversion layer may include at least one of nanocrystals or organic molecules aligned in a predetermined direction. In some embodiments, the organic molecules may include organic dyes. In some embodiments, the color conversion layer may include quantum rods aligned in a predetermined direction. In some embodiments, the reflective polarizer may be a patterned reflective polarizer.

In some embodiments, the first predetermined wavelength band may be a blue wavelength band, and the display may include a first subpixel associated with the first predetermined wavelength band and a second subpixel associated with the second predetermined wavelength band. In some embodiments, the reflective polarizer may include a first polarizer unit corresponding to the first subpixel and a second polarizer unit corresponding to the second subpixel. In some embodiments, the second polarizer unit may include a sub-reflective polarizer, and the first polarizer unit may not include a sub-reflective polarizer.

In some embodiments, the color conversion layer may include a first color conversion unit corresponding to the first subpixel and a second color conversion unit corresponding to the second subpixel. In some embodiments, the second color conversion unit may include a color conversion material configured to absorb a light associated with the first predetermined wavelength band and emit a light associated with the second predetermined wavelength band. In some embodiments, the first color conversion unit may be configured to transmit the light associated with the first predetermined wavelength band without changing the first predetermined wavelength band.

In some embodiments, the color filter layer may include a first color filter configured to transmit a light associated with the first predetermined wavelength band and absorb a light associated with the second predetermined wavelength band, and a second color filter configured to transmit the light associated with the second predetermined wavelength band and absorb the light associated with the first predetermined wavelength band. In some embodiments, the first predetermined wavelength band may be an ultraviolet ("UV") wavelength band, and the reflective polarizer may be a uniform reflective polarizer with a designed operating wavelength band within or corresponding to the UV wavelength band.

In some embodiments, the display may further include a linear polarizer. The optical assembly may be disposed between the linear polarizer and the light-emitting elements. In some embodiments, the color filter array may be disposed between the linear polarizer and the color conversion layer.

In some embodiments, the display may further include a reflector. The light-emitting elements may be disposed between the optical assembly and the reflector. In some embodiments, the light-emitting elements may include a reflector, and the reflector and the optical assembly may be disposed at different sides of the light-emitting elements. In some embodiments, in the optical assembly, the color conversion layer may be disposed between reflective polarizer and the color filter layer. In some embodiments, in the optical assembly, the reflective polarizer may be disposed between the color conversion layer and the color filter array.

In some embodiments, the optical assembly may further include a waveplate disposed between the reflective polarizer and the color conversion layer. In some embodiments, the display may further include a waveplate disposed between the optical assembly and the light-emitting elements. In some embodiments, the display may further include a waveplate, and the waveplate and the optical assembly may be disposed at different sides of the light-emitting elements.

FIG. 1A schematically illustrates a y-z sectional view of a display device or display 100, according to an embodiment of the present disclosure. The display device 100 may be an emissive display device, e.g., an OLED display device, an LED display device, a micro-OLED display device, or a micro-LED display device, etc. As shown in FIG. 1A, the display device 100 may include a display panel 105, a reflective polarizer 110, a color conversion layer 120, and a color filter layer 125. In some embodiments, the reflective polarizer 110, the color conversion layer 120, and the color filter layer 125 may be disposed at a light outputting side of the display panel 105, e.g., disposed at a side (e.g., a first side or surface) of the display panel 105 facing a viewer of the display device 100. In some embodiments, the reflective polarizer 110 may be disposed between the display panel 105 and the color conversion layer 120, and the color conversion layer 120 may be disposed between the reflective polarizer 110 and the color filter layer 125.

In some embodiments, for displaying full color images, the display device 100 may include a plurality of subpixels 150a, 150b, and 150c configured to output image lights in different colors. For example, for displaying full colors, the display device 100 may include red ("R") subpixels, green ("G") subpixels, and blue ("B") subpixels. For example, the first subpixels 150a, the second subpixels 150b, and the third subpixels 150c may be red ("R") subpixels, green ("G") subpixels, and blue ("B") subpixels, respectively. In some embodiments, the display device 100 may include subpixels other than red ("R") subpixels, green ("G") subpixels, or blue ("B") subpixels.

The display panel 105 may include a self-emissive panel that includes a plurality of light-emitting elements (e.g., light-emitting chips, light-emitting diodes) 107 arranged in an array. For example, the display panel 105 may include an OLED display panel, an LED display panel, a micro-OLED display panel, or a micro-LED display panel, etc., in which OLED chips, LED chips, micro-OLED chips, or micro-LED chips, etc., may function as subpixels 107. In some embodiments, the light-emitting elements 107 may be configured to emit unpolarized lights (e.g., image lights) in both forward direction (e.g., +z-axis direction) and backward direction (e.g., -z-axis direction). In some embodiments, the light-emitting elements 107 may be configured to emit unpolarized lights (e.g., image lights) in only one of the forward direction (e.g., +z-axis direction) or the backward direction (e.g., -z-axis direction). In some embodiments, the light-emitting elements 107 may be configured to emit unpolarized lights (e.g., image lights) in the forward direction only. In some embodiments, the light-emitting elements 107 may be configured to emit a blue image light, e.g., the light-emitting elements 107 may include blue OLEDs, blue LEDs, blue micro-OLEDs, or blue micro-LEDs, etc. In some embodiments, the light-emitting elements 107 may be configured to emit an ultraviolet ("UV") image light, e.g., the light-emitting elements 107 may include UV OLEDs, UV LEDs, UV micro-OLEDs, or UV micro-LEDs, etc.

In some embodiments, the reflective polarizer 110 may be configured with a designed operating wavelength band within, at least partially overlapping with, or corresponding to (e.g., substantially the same as) the emission wavelength band (or spectrum) of the light-emitting elements 107. The reflective polarizer 110 may also be referred to as a color-selective reflective polarizer. For example, the designed operating wavelength band (or spectrum) may include the blue wavelength band (i.e., the wavelength band corresponding to the blue color) and/or UV wavelength band. In some embodiments, the reflective polarizer 110 may not be a broadband reflective polarizer that covers, e.g., the entire visible wavelength band.

The reflective polarizer 110 may be configured to selectively reflect or transmit a light having a wavelength within the designed operating wavelength band (e.g., the blue and/or UV wavelength band), depending on the polarization of the light. For example, the reflective polarizer 110 may be configured to substantially reflect the light having the wavelength within the designed operating wavelength band when the light has a first polarization, and substantially transmit the light having the wavelength within the designed operating wavelength band when the light has a second polarization that is orthogonal to the first polarization. In some embodiments, the reflective polarizer 110 may be configured to substantially maintain the polarization of a polarized light having the wavelength within the designed operating wavelength band, while selectively reflecting or transmitting a polarized light.

In some embodiments, for a light having the wavelength outside of the designed operating wavelength band, the reflective polarizer 110 may be configured to transmit the light, independent of the polarization of the light (i.e., regardless of the polarization of the light). The reflective polarizer 110 may maintain the polarization of the light having the wavelength outside of the designed operating wavelength band, while transmitting the light. In some embodiments, for a light having the wavelength outside of the designed operating wavelength band, the reflective polarizer 110 may also be configured to selectively transmit or reflect the light, depending on the polarization of the light. In some embodiments, the reflective polarizer 110 may be configured to change the polarization of a polarized light having the wavelength outside of the designed operating wavelength band, while reflecting the polarized light. For example, the reflective polarizer 110 having the blue operating wavelength band may change the polarization of the polarized light having the wavelength outside of the blue wavelength band from a first polarization to a second polarization that is orthogonal to the first polarization, while reflecting the polarized light. In some embodiments, the reflective polarizer 110 may be configured to transmit a polarized light having the wavelength outside of the designed operating wavelength band, while maintaining the polarization of the polarized light or changing the polarization of the polarized light from a first polarization to a second polarization that is orthogonal to the first polarization.

For discussion purposes, in the following descriptions, the reflective polarizer 110 is presumed to transmit the light having the wavelength outside of the designed operating wavelength band, independent of the polarization of the light (i.e., regardless of the polarization of the light). In addition, the reflective polarizer 110 is presumed to maintain the polarization of the light having the wavelength outside of the designed operating wavelength band, while transmitting the light.

In some embodiments, the reflective polarizer 110 may be a circular reflective polarizer, e.g., a cholesteric liquid crystal reflective polarizer, etc. In some embodiments, the circular reflective polarizer may include biaxial liquid crystals, and/or uniaxial liquid crystals. In some embodiments, the reflective polarizer 110 may be a linear reflective polarizer, e.g., a quarter-wave stack reflective polarizer, a wire-grid reflective polarizer, or a notch thin-film reflective polarizer, etc. A quarter-wave stack reflective polarizer may include a series of layers with alternating high and low refractive indices in a predetermined principal axis. The optical thickness (e.g., $d*\Delta n$, where d is the thickness of the layer, and $\Delta n$ is the birefringence of the layer) of each layer may correspond to a quarter of the designed operating wavelength. A notch thin-film reflective polarizer may include a series of waveplates with alternating high and low refractive indices in a predetermined principal axis. The optical thickness of the respective waveplates for the operating wavelength band may be respectively configured. For example, the optical thickness of the waveplate for the operating wavelength band may be a quarter wave. A notch thin-film reflective polarizer may have a reduced side band reflection compared to a quarter-wave stack reflective polarizer. In the present disclosure, a light may be associated with a specific wavelength, or may be associated with a wavelength band (i.e., a range of wavelengths). For discussion purposes, in some descriptions, a light may be referred to as a light having a wavelength. It is understood that the light may be associated with a wavelength band.

The color conversion layer 120 may include a color conversion material configured to covert the light emitted by the light-emitting elements 107 into lights of a predetermined color that may be different from the color of the light emitted by the light-emitting elements 107. For discussion purposes, the color of the light emitted by the light-emitting elements 107 may be referred to as an emission color, and the color of the lights converted by the color conversion material may be referred to as a conversion color. The conversion color may be different from the emission color. In some embodiments, color conversion material may have an absorption band at least partially overlapping with (e.g., substantially the same as) the emission wavelength band of the light-emitting elements 107. The color conversion material may absorb the image light emitted by the light-emitting elements 107 and emit a light of a conversion color. In some embodiments, the color conversion layer 120 may include a plurality of color conversion materials configured to covert the light emitted by the light-emitting elements 107 into lights of a plurality of conversion colors.

In some embodiments, the color conversion layer 120 may include a plurality of first color conversion units 120a corresponding to the first (e.g., red) subpixels 150a, a plurality of second color conversion units 120b corresponding to the second (e.g., green) subpixels 150b, and a plurality of third color conversion units 120c corresponding to the third (e.g., blue) subpixels 150c. In some embodiments, when the display device 100 includes additional subpixels (e.g., yellow subpixels), the color conversion layer 120 may also include additional color conversion units corresponding to the additional subpixels.

In some embodiments, the light-emitting elements 107 may be configured to emit a blue image light. The reflective polarizer 110 may be a patterned reflective polarizer with a designed operating wavelength band within, at least partially overlapping with, or corresponding to (e.g., substantially the same as) the blue wavelength band. For example, the reflective polarizer 110 may be a patterned blue reflective polarizer. In some embodiments, the reflective polarizer 110 may include a plurality of sub-reflective polarizers with a designed operating wavelength band within, at least partially overlapping with, or corresponding to (e.g., substantially the same as) the blue wavelength band. In addition, the patterned reflective polarizer may include a plurality of first polarizer units 110a, second polarizer units 110b, and third polarizer units 110c corresponding to the first (e.g., red) subpixels 150a, the second (e.g., green) subpixels 150b, and the third (e.g., blue) subpixels 150c, respectively. In some embodiments, both of the first polarizer units 110a and the second polarizer units 110b may include the sub-reflective polarizers. The third polarizer units 110c may not include any sub-reflective polarizer.

In some embodiments, the first color conversion units 120a may include a first color conversion material configured to absorb the blue image light and emit a first (e.g., red) converted image light. The second color conversion units 120b may include a second color conversion material configured to absorb the blue image light and emit a second (e.g., green) converted image light. The third color conversion units 120c may not include a color conversion material, and may directly transmit the blue image light emitted by the light-emitting elements 107.

In some embodiments, the light-emitting elements 107 may be configured to emit a UV light. In some embodiments, the reflective polarizer 110 may not be a patterned reflective polarizer. Instead, the reflective polarizer 110 may be a uniform reflective polarizer with a designed operating wavelength band within, at least partially overlapping with, or corresponding to (e.g., substantially the same as) the UV wavelength band, e.g., a UV reflective polarizer. The first polarizer units 110a, the second polarizer units 110b, and the third polarizer units 110c may each include one or more of the sub-reflective polarizers. In some embodiments, the first color conversion units 120a may include a first color conversion material configured to absorb the UV image light and emit a first (e.g., red) image light, the second color conversion units 120b may include a second color conversion material configured to absorb the UV image light and emit a second (e.g., green) image light, and the third color conversion units 120c may include a third color conversion material configured to absorb the UV image light and emit a third (e.g., blue) image light.

In some embodiments, the reflective polarizer 110 may be configured to convert an unpolarized image light emitted from the light-emitting elements 107 into a polarized image light with an enhanced light transmission efficiency. The polarized image light of the emission color may propagate toward the color conversion layer 120. In some embodiments, the color conversion layer 120 may be configured to covert the polarized image light of the emission color into one or more polarized image lights of one or more conversion colors. In some embodiments, when converting the polarized image light of the emission color, the color conversion layer 120 may substantially maintain the polarization of the polarized image light.

In some embodiments, the color conversion layer 120 may include any suitable color conversion materials configured to convert a light of the emission color into a light of the conversion color, which may be different from the emission color, and substantially maintain the polarization of the light during the color conversion process. For example, the color conversion layer 120 may include nanocrystals, organic molecules, or a combination thereof. In some embodiments, the nanocrystals or the organic molecules may be aligned in a predetermined direction, thereby ensuring the macroscopic anisotropy of the absorption of a light of the emission color and/or the emission of a light of the conversion color.

In some embodiments, the nanocrystals may include quantum rods and/or semiconductor nanoplatelets. In some embodiments, the quantum rod may have a sphere core and a rod shell, which may also be referred to as quantum dot sphere in rod. In some embodiments, the quantum rod may have a rod core and a rod shell, which may also be referred to as quantum dot rod in rod. The quantum rod may have a longitudinal axis (or an axis in the length direction) and a lateral axis (or an axis in the width direction). The longitudinal axis of the quantum rod may be referred to as a director of the quantum rod. In some embodiments, the quantum rods may be aligned (or the directors of the quantum rods may be oriented) in a predetermined direction, and the aligned quantum rods may exhibit an anisotropic absorption of a light of the emission color and/or an anisotropic emission of a light of the conversion color. In some embodiments, the semiconductor nanoplatelets have quantum well electric structures.

In some embodiments, the organic molecules may include organic dyes, such as fluorescent dyes. In some embodiments, the organic dye may have a rod-like shape with a longitudinal axis (or an axis in the length direction) and a lateral axis (or an axis in the width direction). The longitudinal axis of the organic dye may be referred to as a director of the organic dye. In some embodiments, the organic dyes may be aligned (e.g., the directors of the organic dyes may be oriented) in a predetermined direction, and the aligned organic dyes may exhibit an anisotropic absorption of a light of the emission color and/or an anisotropic emission of a light of the conversion color.

In some embodiments, the nanocrystals (e.g., quantum rods and/or semiconductor nanoplatelets), the organic molecules, or the organic dyes may be aligned via any suitable mechanism, such as stretching a quantum rod-polymer film, electrospinning, electric or magnetic field induction, mechanical rubbing, slot die-coating, flowing alignment (e.g., inkjet printing), photoalignment, or a combination thereof. In some embodiments, the conversion efficiency of the color conversion layer 120 may be determined, in part, by the aspect ratio of the quantum rods and/or the semiconductor nanoplatelets. In some embodiments, a higher aspect ratio of the quantum rods/semiconductor nanoplatelets may result in a higher conversion efficiency of the color conversion layer 120. In some embodiments, the conversion efficiency of the color conversion layer 120 may be determined, in part, by the alignment of the nanocrystals (e.g., quantum rods and/or semiconductor nanoplatelets), the organic molecules (e.g., the organic dyes). In some embodiments, a more uniform alignment of the nanocrystals (e.g., quantum rods and/or semiconductor nanoplatelets), the organic molecules (e.g., the organic dyes) may result in a higher conversion efficiency of the color conversion layer 120. In some embodiment, the conversion efficiency of the color conversion layer 120 may be about 60% to about 100%.

The color filter layer 125 may be an absorptive color filter layer. The color filter layer 125 may include a plurality of color filters arranged in an array. In some embodiments, the color filter layer 125 may include first color filters 125a corresponding to the first (e.g., red) subpixels 150a, second color filters 125b corresponding to the second (e.g., green) subpixels 150b, and third color filters 125c corresponding to the third (e.g., blue) subpixels 150c. In some embodiments, when the display device 100 includes additional subpixels (e.g., yellow subpixels), the color filter layer 125 may also include additional color filters (e.g., yellow color filters) corresponding to the additional subpixels. In some embodiments, the color filter 124 may include a color resist configured to substantially transmit a light having a predetermined color, and substantially absorb lights having colors other than the predetermined color. For example, the first color filters 125a may substantially transmit a red light, and substantially absorb a green light and a blue light. The second color filters 125b may substantially transmit a green light, and substantially absorb a red light and a blue light. The third color filters 125c may substantially transmit a blue light, and substantially absorb a red light and a green light.

In some embodiments, the display device 100 may also include a reflector 135 disposed at bottom of the display panel 105. The reflector 135 may also be referred to as a bottom reflector 135. For example, the reflector 135 may be disposed at a side (e.g., a second side or surface) of the display panel 105 opposite to the light outputting side (e.g., the first side or surface) at the viewer's side of the display device 100. The reflector 135 may be configured to reflect a light propagating in the backward direction to propagating in the forward direction. In some embodiments, for a polarized light, the reflector 135 may be configured to change a polarization of the polarized light to an opposite polarization, while reflecting the polarized light. In some embodiments, the light-emitting element 107 may include one or more substrates, an anode, an emissive layer, and a cathode disposed on the substrate. In some embodiments, both the anode and the cathode may be transparent electrodes, and the reflector 135 may be disposed adjacent one of the anode and the cathode. In some embodiments, one of the anode and cathode may be a transparent electrode and the other may be a reflective electrode, such as a metal electrode with a high reflectivity. The reflective electrode may be arranged at the bottom (or second surface) of the display panel 105, and may function as the reflector 135.

In some embodiments, the display device 100 may also include a waveplate 115 disposed between the reflective polarizer 110 and the color conversion layer 120. The waveplate 115 may be configured to convert a linearly polarized light to a circularly polarized light or vice versa. In such an embodiment, the waveplate 115 may be configured to function as quarter-wave plate ("QWP") with a designed operating wavelength band within, at least partially overlapping with, or corresponding to (e.g., substantially the same as) a visible spectrum and/or a UV spectrum. In some embodiments, for an achromatic design, the waveplate 115 may include a multilayer birefringent material (e.g., polymer, liquid crystals, or organic solid crystals) configured to produce a quarter-wave birefringence (or quarter-wave phase retardation) across a wide spectral range. In some embodiments, for a monochrome design, an angle between a polarization axis (i.e., fast axis) of the waveplate 115 and a polarization direction of an input linearly polarized light may be approximately 45 degrees.

In some embodiments, when selectively reflecting or transmitting a polarized light, the reflective polarizer 110 may introduce an undesirable phase retardation between two orthogonally polarized components of the polarized light, resulting in a change in the polarization (also referred to as a polarization deviation) of the polarized light. In such an embodiment, the waveplate 115 may be configured to compensate for the undesirable phase retardation introduced by the reflective polarizer 110. In other words, the waveplate 115 may be configured to function as both of a compensation plate and a QWP. For example, in addition to providing the quarter-wave phase retardation to the polarized light output from the reflective polarizer 110, the waveplate 115 may also be configured to provide an amount of compensating phase retardation that is opposite to the amount of the undesirable phase retardation. In some embodiments, the absolute values of the compensating phase retardance and the undesirable phase retardance may be substantially the same, and the signs may be opposite. Due to such compensations, the undesirable phase retardance may not cause an undesirable effect in a light output from the stack of the reflective polarizer 110 and the waveplate 115.

In some embodiments, the display device 100 may also include a linear polarizer 130 disposed at the color filter layer 125. The color filter layer 125 may be disposed between the linear polarizer 130 and the color conversion layer 120. The linear polarizer 130 may be an absorptive linear polarizer. In some embodiments, an orientation of a polarization axis (or transmission axis) of the linear polarizer 130 with respective to the polarization axis (i.e., fast axis) of the waveplate 115 may be configured, such that the waveplate 115 may be configured to convert a linearly polarized light output from the linear polarizer 130 to a circularly polarized light toward the reflective polarizer 110.

For illustrative purposes, in FIG. 1A, the linear polarizer 130, the color filter layer 125, the color conversion layer 120, the waveplate 115, the reflective polarizer 110, the display panel 105, and the reflector 135 are drawn as having flat surfaces. In some embodiments, one or more of the linear polarizer 130, the color filter layer 125, the color conversion layer 120, the waveplate 115, the reflective polarizer 110, the display panel 105, and the reflector 135 may have curved surfaces. In the embodiment shown in FIG. 1A, the linear polarizer 130, the color filter layer 125, the color conversion layer 120, the waveplate 115, the reflective polarizer 110, the display panel 105, and the reflector 135 are shown as spaced apart from one another by a gap. In some embodiments, the linear polarizer 130, the color filter layer 125, the color conversion layer 120, the waveplate 115, the reflective polarizer 110, the display panel 105, and the reflector 135 may be stacked without a gap (e.g., in direct contact with one another). The display device 100 may also include other elements that are not shown in FIG. 1A. In some embodiments, one or more components shown in FIG. 1A may be omitted.

Figure 1B:
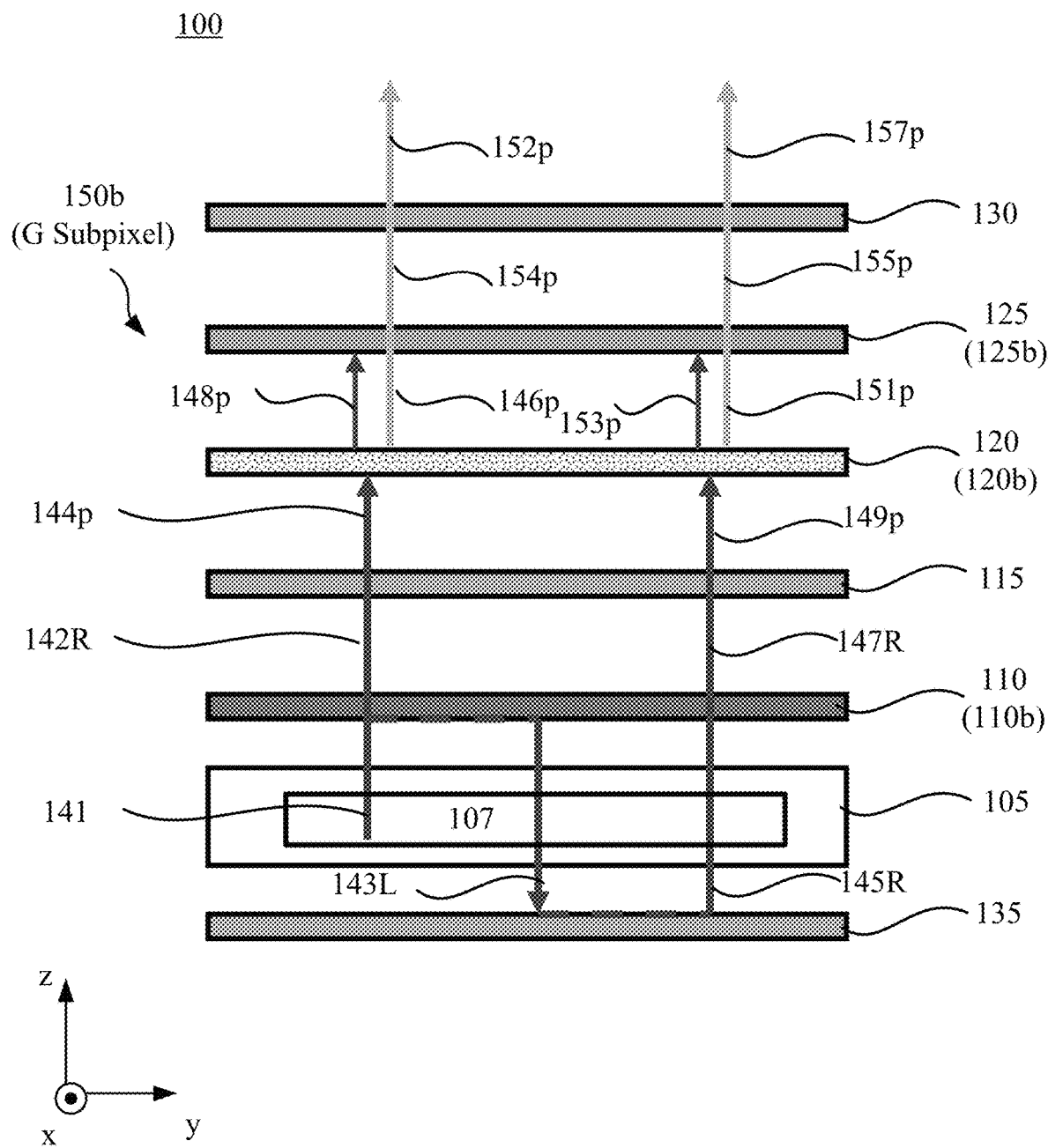
FIG. 1B schematically illustrates an optical path of an image light propagating in the display device shown in FIG. 1A, according to an embodiment of the present disclosure.
Figure 1C:
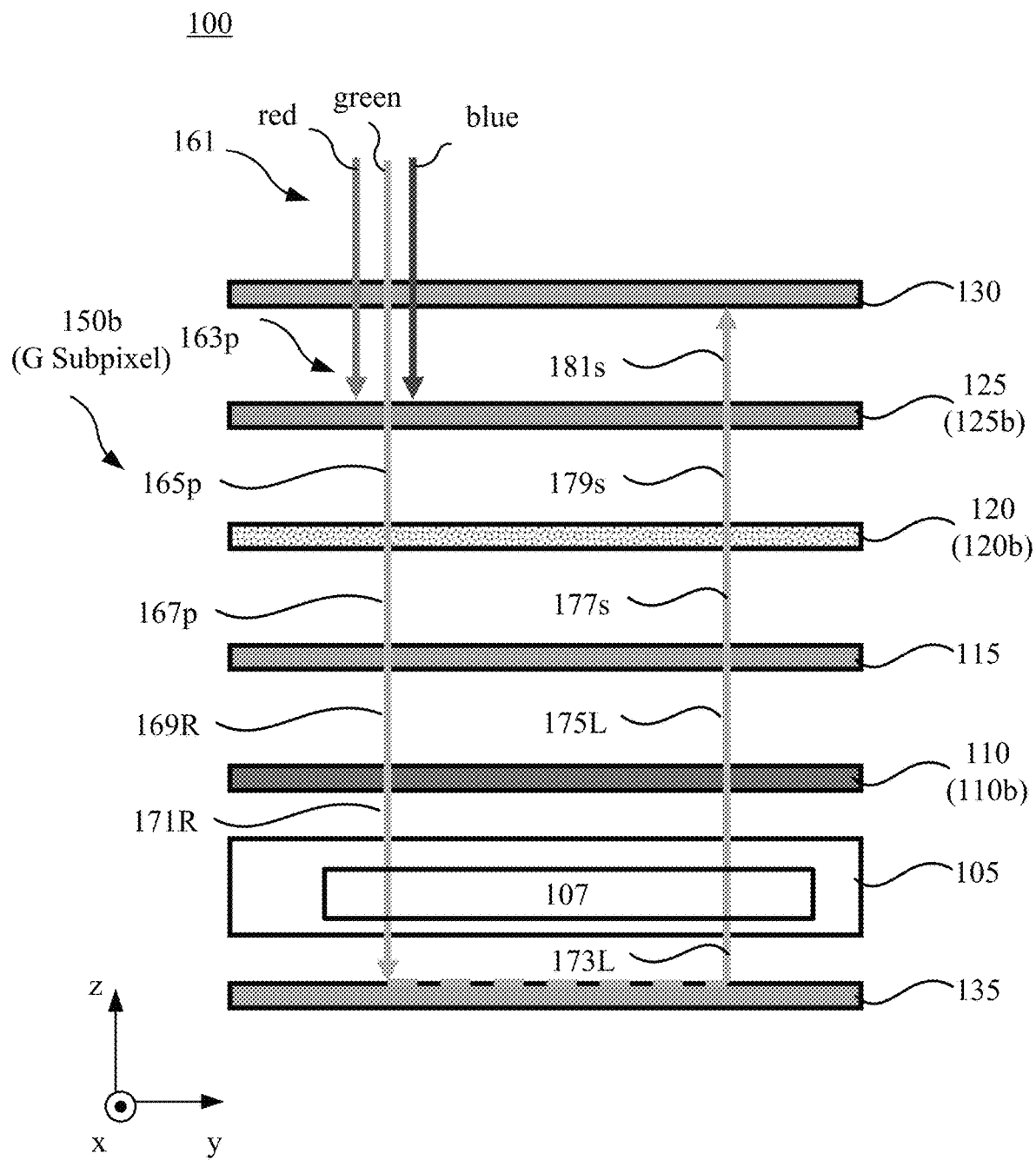
FIG. 1C schematically illustrates an optical path of an ambient light propagating in the display device shown in FIG. 1A, according to an embodiment of the present disclosure.

In the embodiment shown in FIG. 1A, the light-emitting element 107 may emit an image light of blue color, and the reflective polarizer 110 may be a circular reflective polarizer with a designed operating wavelength hand within, at least partially overlapping with, or corresponding to (e.g., substantially the same as) the emission wavelength band of the light-emitting elements 107, e.g., the blue wavelength band. FIG. 1B schematically illustrates an optical path of an image light 141 propagating in the display device 100 shown in FIG. 1A, according to an embodiment of the present disclosure. FIG. 1C schematically illustrates an optical path of an ambient light 161 propagating in the display device 100 shown in FIG. 1A, according to an embodiment of the present disclosure. For discussion purposes, FIG. 1B or FIG. 1C shows a portion of the optical path of the image light 141 or the ambient light 161 propagating through a single second subpixel (e.g., green subpixel) 150b. Optical paths of the image light 141 or the ambient light 161 propagating through other subpixels (e.g., red subpixels 150a) of the display device 100 may be substantially the same as that shown in FIG. 1B or FIG. 1C. In FIG. 1B and FIG. 1C, "R" denotes a right-handed circularly polarized ("RHCP") light, "L" denotes a left-handed circularly polarized ("LHCP") light, "s" denotes an s-polarized and "p" denotes a p-polarized light. An s-polarized light and a p-polarized light are linearly polarized lights with orthogonal polarizations. An RHCP light and an LHCP light are circularly polarized lights with orthogonal polarizations.

For discussion purpose, in FIG. 1B, the light-emitting element 107 may emit an image light 141 that is an unpolarized, blue image light. That is, the image light 141 may be associated with a first predetermined wavelength band, e.g., the blue wavelength band. The image light 141 may propagate in the forward direction toward the reflective polarizer 110. The reflective polarizer 110 may be a circular reflective polarizer with a designed operating wavelength band within, at least partially overlapping with, or corresponding to (e.g., substantially the same as) the emission wavelength band of the light-emitting elements 107, e.g., the blue light or the blue wavelength band. For discussion purpose, the reflective polarizer 110 may be a left-handed circular reflective polarizer configured to substantially reflect an LHCP light, and substantially transmit an RHCP light. For discussion purpose, the reflective polarizer 110 may substantially maintain a polarization of a polarized light while reflecting or transmitting the polarized light.

As shown in FIG. 1B, the second polarizer units 110b in the reflective polarizer 110 may be configured to substantially transmit an RHCP component of the image light (e.g., blue image light) 141 as an RHCP image light 142R propagating toward the waveplate 115, and substantially reflect an LHCP component of the image light (e.g., blue image light) 141 as an LHCP image light 143L propagating toward the display panel 105 and the reflector 135. In some embodiments, the display panel 105 may directly transmit the LHCP image light 143L, while substantially maintaining the polarization of the image light transmitted therethrough. The reflector 135 may be configured to reflect the LHCP image light 143L as an RHCP image light 145R back to the reflective polarizer 110. The reflective polarizer 110 may substantially transmit the RHCP image light 145R as an RHCP image light 147R propagating toward the waveplate 115.

In some embodiments, the display panel 105 may partially transmit the LHCP image light 143L, and partially absorb the LHCP image light 143L and emit an unpolarized image light (e.g., similar to the image light 141) propagating toward the reflective polarizer 110. In some embodiments, the display panel 105 may change a polarization of an image light (e.g., blue image light) transmitted therethrough, e.g., the display panel 105 may transmit the LHCP image light 143L as an image light (not shown) having a polarization other than the left-handed circular polarization. For example, the transmitted image light may include both of an LHCP component and an RHCP component. The reflector 135 may be configured to reflect the LHCP component and the RHCP component of the transmitted image light as an RHCP image light and an LHCP image light back to the reflective polarizer 110, respectively. The reflective polarizer 110 may substantially transmit the RHCP image light as an RHCP image light propagating toward the waveplate 115, and substantially reflect the LHCP image light as an LHCP image light propagating toward the display panel 105 and the reflector 135. The LHCP image light may have an optical path similar to that of the LHCP image light 143L.

For discussion purposes, in the following description, the display panel 105 is presumed to directly transmit a light, while substantially maintaining the polarization of a light transmitted therethrough. The waveplate 115 may be configured to convert the RHCP image lights 142R and 147R into linearly polarized image lights, e.g., p-polarized image lights 144p and 149p, which propagate toward the color conversion layer 120, while transmitting the RHCP image lights 142R and 147R. The second color conversion unit 120b included in the color conversion layer 120 may be configured to convert the p-polarized image lights 144p and 149p of blue color into p-polarized image lights 146p and 151p of green color, respectively. That is, the p-polarized image lights 146p and 151p may be associated with a second predetermined wavelength band, e.g., the green wavelength band (i.e., the wavelength band corresponding to the green color). For example, the second color conversion units 120b may include the second color conversion material configured to absorb the p-polarized image lights 144p and 149p of blue color and emit the p-polarized image lights 146p and 151p of green color. In some embodiments, the p-polarized image lights 144p and 149p of blue color may not be fully converted into the p-polarized image lights 146p and 151p of green color by the second color conversion unit 120b. In some embodiments, portions of the p-polarized image lights 144p and 149p of blue color may be transmitted through the second color conversion unit 120b as p-polarized image lights 148p and 153p of blue color. The p-polarized image lights 146p and 151p of green color, and the p-polarized image lights 148p and 153p of blue color may propagate toward the color filter layer 125.

The second color filters (e.g., green color filters) 125b may be configured to substantially transmit the p-polarized lights 146p and 151p of green color as p-polarized image lights 154p and 155p propagating toward the linear polarizer 130, and substantially block the p-polarized image lights 148p and 153p of blue color. The linear polarizer 130 may be configured to substantially transmit a p-polarized light and substantially block an s-polarized light. Thus, the p-polarized image lights 154p and 155p of green color may be transmitted through the linear polarizer 130 as p-polarized image lights 152p and 157p of green color that are perceived by a viewer of the display device 100.

Due to the polarization selectivity of the reflective polarizer 110 and the polarization reversion of the reflector 135, a polarization recirculation of the image light 141 emitted from the light-emitting element 107 may be achieved, which may significantly increase the light transmission efficiency of the display device 100. Accordingly, the power efficiency of the display device 100 may be significantly increased.

Referring to FIGS. 1A and 1B, the optical path of the image light 141 propagating through other subpixels (e.g., red subpixels 150a) of the display device 100 may be substantially the same as that shown in FIG. 1B. For example, the image light 141 propagating through the red subpixels 150a may be output as a p-polarized image light of red color from the linear polarizer 130. The image light 141 propagating through the blue-subpixels 150c of the display device 100 may not be subject to the polarization-selective reflection or transmission of the reflective polarizer 110, as the third polarizer units 110c corresponding to the third (e.g., blue) subpixels 150c may not include any sub-reflective polarizer. Instead, the image light 141 of the blue color may be directly transmitted through the third polarizer units 110c of the reflective polarizer 110. In addition, the image light 141 propagating through the blue-subpixels 150c of the display device 100 may not be subject to the color conversion process of the color conversion layer 120, as the third color conversion units 120c corresponding to the third (e.g., blue) subpixels 150c may not include a color conversion material. Instead, the image light 141 of the blue color may be directly transmitted through the third color conversion units 120c of the color conversion layer 120. The image light 141 propagating through the blue-subpixels 150c of the display device 100 may be output as a p-polarized image light of blue color from the linear polarizer 130. Thus, the display device 100 may display full color images with enhanced brightness.

As shown in FIG. 1C, the ambient light 161 may be a polychromatic visible light including a red portion, a green portion, and a blue portion. For discussion purposes, the ambient light 161 may be an unpolarized light. The linear polarizer 130 may be configured to convert the ambient light 161 into a p-polarized light 163p propagating toward the color filter layer 125. The second color filter (e.g., green color filter) 125b in the color filter layer 125 may be configured to substantially transmit the green portion of the p-polarized light 163p as a p-polarized light 165p of green color propagating toward the color conversion layer 120, and substantially block the red and blue portions of the p-polarized light 163p. The second color conversion unit 120b in the color conversion layer 120 may be configured to substantially transmit the p-polarized light 165p of green color as a p-polarized light 167p of green color propagating toward the waveplate 115. The waveplate 115 may be configured to convert the p-polarized light 167p of green color into an RHCP light 169R of green color propagating toward the reflective polarizer 110.

The second polarizer unit 110b in the reflective polarizer 110 with a designed operating wavelength band within, at least partially overlapping with, or corresponding to (e.g., substantially the same as) the blue wavelength band may transmit the RHCP light 169R of green color as an RHCP light 171R of green color propagating toward the display panel 105 and the reflector 135. The reflector 135 may be configured to reflect the RHCP light 171R of green color as an LHCP light 173L of green color back to the display panel 105, and to the reflective polarizer 110. The second polarizer unit 110b in the reflective polarizer 110 with the designed operating wavelength band within, at least partially overlapping with, or corresponding to (e.g., substantially the same as) the blue wavelength band may transmit the LHCP light 173L of green color as an LHCP light 175L of green color propagating toward the waveplate 115. The waveplate 115 may be configured to convert the LHCP light 175L of green color into an s-polarized light 177s of green color propagating toward the color conversion layer 120. The second color conversion unit 120b in the color conversion layer 120 may be configured to substantially transmit the s-polarized light 177s of green color as an s-polarized light 179s of green color propagating toward the color filter layer 125. The second color filter (e.g., green color filter) 125b in the color filter layer 125 may be configured to substantially transmit the s-polarized light 179s of green color as an s-polarized light 181s of green color propagating toward the linear polarizer 130. The linear polarizer 130 may block, via absorption, the s-polarized light 181s of green color from being output from the display device 100.

Due to the color selective absorption of the color filter layer 125 and the polarization reversion of the reflector 135, the red and blue portions of the ambient light 161 may be absorbed by the second color filters (e.g., green color filters) 125b in the color filter layer 125, and the green portion of the ambient light 161 reflected by the reflector 135 may be absorbed by the linear polarizer 130. Referring to FIG. 1A and FIG. 1C, the optical path of the ambient light 161 propagating through other subpixels (e.g., red subpixels 150a, blue-subpixels 150c) of the display device 100 may be substantially the same as that shown in FIG. 1C. For example, the ambient light 161 propagating through the red subpixels 150a and the blue-subpixels 150c may be converted to an s-polarized light of red color and an s-polarized light of blue color, which may be blocked by the linear polarizer 130 from being output out of the display device 100. Thus, the reflection of the ambient light 161 from the reflector 135 may be reduced. The reflection of the ambient light 161 by the display device 100 may not be perceived by the viewer of the display device 100. The contrast ratio of the display device 100 may be significantly increased, and the image performance of the display device 100 may be significantly enhanced.

A conventional emissive display device including an emissive display panel and an absorptive circular polarizer laminated with the emissive display panel may have a power efficiency of about 50%, as half of the image light emitted from the emissive display panel may be absorbed by the absorptive circular polarizer. In the disclosed display device 100 shown in FIGS. 1A-1C, for the unpolarized image light 141 emitted from the display panel 105, the reflective polarizer 110 may be configured to output a polarized image light (e.g., a combination of the RHCP lights 142R and 147R) with a light transmission efficiency of about 50% to about 100%. In other words, the reflective polarizer 110 may be configured to provide a polarized emission enhancement of about 100% to 200%, as compared to the absorptive circular polarizer included in conventional emissive display devices. In some embodiment, the conversion efficiency of the color conversion layer 120 may be about 60% to about 100%.

In some embodiment, when the light transmission efficiency of the reflective polarizer 110 is about 80% (or the polarized emission enhancement of the reflective polarizer 110 is configured to be about 160%), and the conversion efficiency of the color conversion layer 120 is configured to be about 80%, an overall power efficiency of the disclosed display device 100 may be about 64%. Compared to the overall power efficiency of the conventional emissive display device (e.g., 50%), the overall power efficiency of the disclosed display device 100 may be improved by about 28%. In other words, the image brightness of the disclosed display device 100 may be enhanced by about 28% as compared to the conventional emissive display device.

In addition, due to the color selective absorption of the color filter layer 125 and the polarization reversion of the reflector 135, the reflection of the ambient light 161 by the display device 100 may not be output from the display device 100 and perceived by the viewer. Compared to a conventional emissive display device including an emissive display panel and a reflective polarizer laminated with the emissive display panel, the contrast ratio of the display device 100 may be significantly increased, and the image performance of the display device 100 may be significantly enhanced.

Figure 1D:
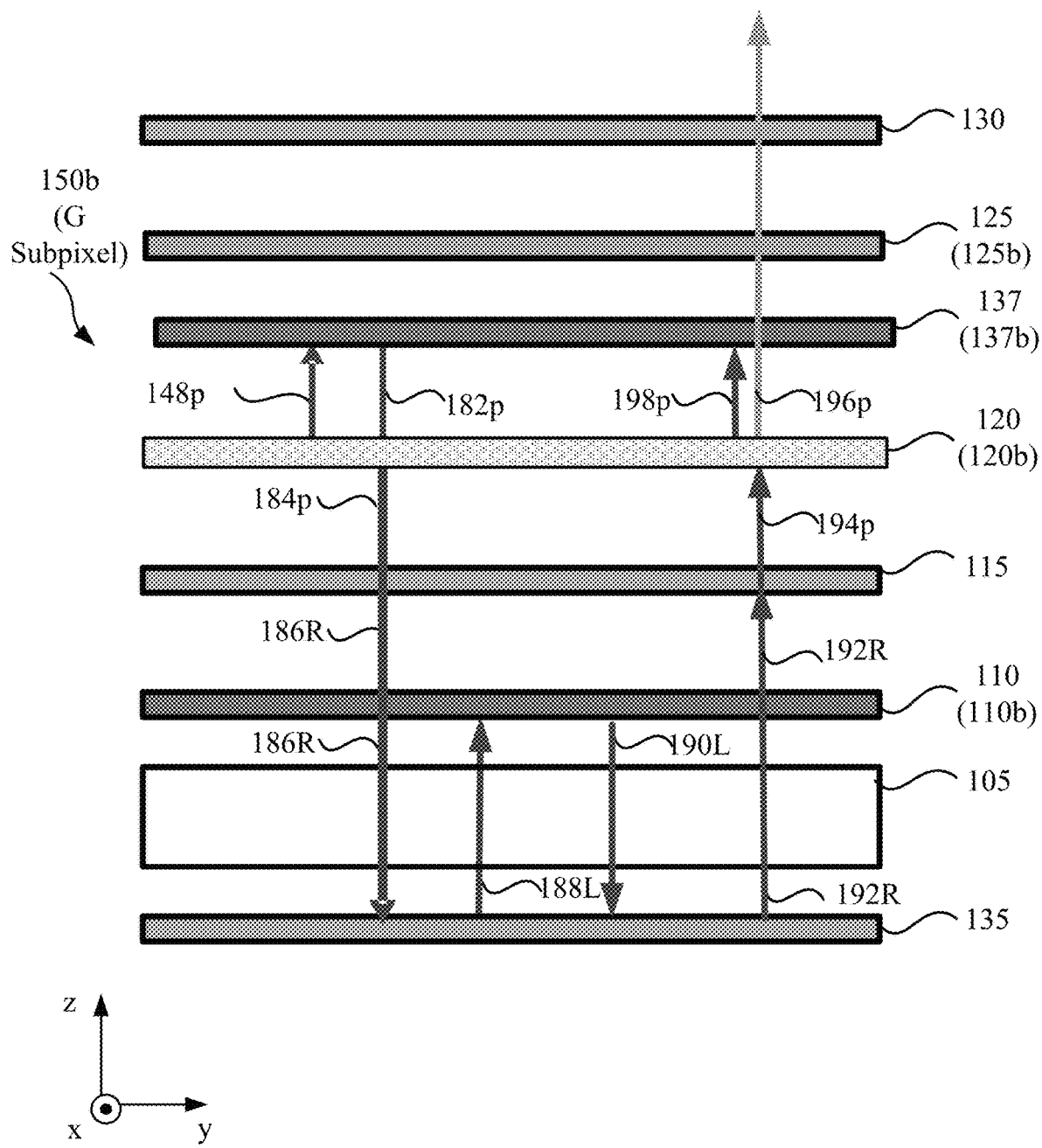
FIG. 1D schematically illustrates an optical path of an unconverted image light propagating in the display device shown in FIG. 1A with an additional reflector, according to an embodiment of the present disclosure.

FIG. 1D schematically illustrates an optical path of an unconverted image light propagating in the display device 100 shown in FIG. 1A with an additional reflector, according to an embodiment of the present disclosure. In some embodiments, as shown in FIG. 1D, the display device 100 may include a reflector 137 configured to recycle the unconverted image light (e.g., the p-polarized lights 148p and 153p of blue color shown in FIG. 1B), thereby further enhancing the overall power efficiency and brightness of the display device 100. In some embodiments, as shown in FIG. 1D, the reflector 137 may be disposed between the color conversion layer 120 and the color filter layer 125. In some embodiments, the reflector 137 may be a narrowband reflector with a designed operating wavelength band within, at least partially overlapping with, or corresponding to (e.g., substantially the same as) the emission wavelength band of the light-emitting elements 107, e.g., blue wavelength band, UV wavelength band.

In some embodiments, the reflector 137 may include a narrowband reflective polarizer, or a distributed Bragg reflector ("DBR"), etc. In some embodiments, the reflector 137 may be configured to substantially reflect an image light of the emission color, when the image light of the emission color has a predetermined polarization. In some embodiments, the reflector 137 may reflect the image light of the emission color independent of the polarization of the image light of the emission color. The reflector 137 with a designed operating wavelength band within, at least partially overlapping with, or corresponding to (e.g., substantially the same as) the emission wavelength band of the light-emitting elements 107 may be configured to substantially transmit an image light of conversion color (e.g., an image of green color), independent of the polarization of the image light of conversion color. In addition, the reflector 137 may be configured to substantially maintain the polarization of an image light of conversion color, while transmitting the image light of conversion color.

For discussion purposes, in FIG. 1D, the unconverted image light may be the p-polarized image light 148p of blue color output from the color conversion layer 120. The reflector 137 may be a linear reflective polarizer. In some embodiments, the light-emitting elements 107 may be configured to emit a blue image light. The reflector 137 may be a patterned reflective polarizer including a plurality of sub-reflective polarizers. The reflector 137 may also include a plurality of first polarizer units (not shown) corresponding to the first (e.g., red) subpixels 150a, second polarizer units 137b corresponding to the second (e.g., green) subpixels 150b, and third polarizer units (not shown) corresponding to the third (e.g., blue) subpixels 150c. In some embodiments, both of the first polarizer units (not shown) corresponding to the first (e.g., red) subpixels 150a and the second polarizer units 137b corresponding to the second (e.g., green) subpixels 150b may include the sub-reflective polarizers. The third polarizer units (not shown) corresponding to the third (e.g., blue) subpixels 150c may not include any sub-reflective polarizer.

In some embodiments, the light-emitting elements 107 may be configured to emit a UV light. In some embodiments, the reflector 137 may not be a patterned reflective polarizer. Instead, the reflector 137 may be a uniform reflective polarizer with a designed operating wavelength band within, at least partially overlapping with, or corresponding to (e.g., substantially the same as) the UV wavelength band. The first polarizer units (not shown) corresponding to the first (e.g., red) subpixels 150a, the second polarizer units 137b corresponding to the second (e.g., green) subpixels 150b, and the third polarizer units (not shown) corresponding to the third (e.g., blue) subpixels 150c may include the sub-reflective polarizers.

For illustrative purposes, in FIG. 1D, the reflector 137 is shown as a patterned reflective polarizer with a designed operating wavelength band within, at least partially overlapping with, or corresponding to (e.g., substantially the same as) the blue wavelength band. For discussion purposes, the reflector 137 may be configured to substantially reflect a p-polarized light of blue color. The reflector 137 may be configured to substantially maintain the polarization of a polarized light, while selectively reflecting or transmitting the polarized light. As shown in FIG. 1D, the second polarizer units 137b in the reflector 137 may substantially reflect the p-polarized image light 148p of blue color output from the color conversion layer 120 back to the color conversion layer 120. For example, the second polarizer units 137b in the reflector 137 may reflect the p-polarized image light 148p of blue color as a p-polarized image light 182p of blue color prorogating toward the color conversion layer 120.

The second color conversion unit 120b in the color conversion layer 120 may partially convert the p-polarized image light 182p of blue color to a p-polarized image light of green color (not shown), and partially transmit the p-polarized image light 182p of blue color as a p-polarized image light 184p of blue color toward the waveplate 115. The waveplate 115 may convert the p-polarized image light 184p of blue color to an RHCP image light 186R of blue color propagating toward the reflective polarizer 110. The second polarizer units 110b in the reflective polarizer 110 may substantially transmit the RHCP image light 186R of blue color toward the display panel 105 and the reflector 135.

The reflector 135 may reflect the RHCP image light 186R of blue color as an LHCP image light 188L of blue color back to the display panel 105 and the reflective polarizer 110. The reflective polarizer 110 may substantially reflect the LHCP image light 188L of blue color as an LHCP image light 190L of blue color toward the display panel 105 and the reflector 135. The reflector 135 may reflect the LHCP image light 190L of blue color as an RHCP image light 192R of blue color toward the display panel 105 and the reflective polarizer 110.

The second units 110b in the reflective polarizer 110 may substantially transmit the RHCP image light 192R of blue color toward the waveplate 115. The waveplate 115 may convert the RHCP image light 192R of blue color into a p-polarized image light 194p of blue color propagating toward the color conversion layer 120. The second color conversion unit 120b in the color conversion layer 120 may partially convert the p-polarized image light 194p of blue color into a p-polarized image light 196p of green color, and partially transmit the p-polarized image light 194p of blue color as a p-polarized image light 198p of blue color. The p-polarized image light 196p of green color and the unconverted p-polarized image light 198p of blue color may propagate toward the reflector 137.

The reflector 137 may transmit the p-polarized image light 196p of green color toward the color filter layer 125 and the linear polarizer 130. The p-polarized image light 196p of green color may be transmitted through the color filter layer 125 and the linear polarizer 130, and may be perceived by the viewer of the display device 100. The unconverted p-polarized image light 198p of blue color may be subject to an optical path that is the same as the unconverted p-polarized image light 148p of blue color.

Figure 2A:
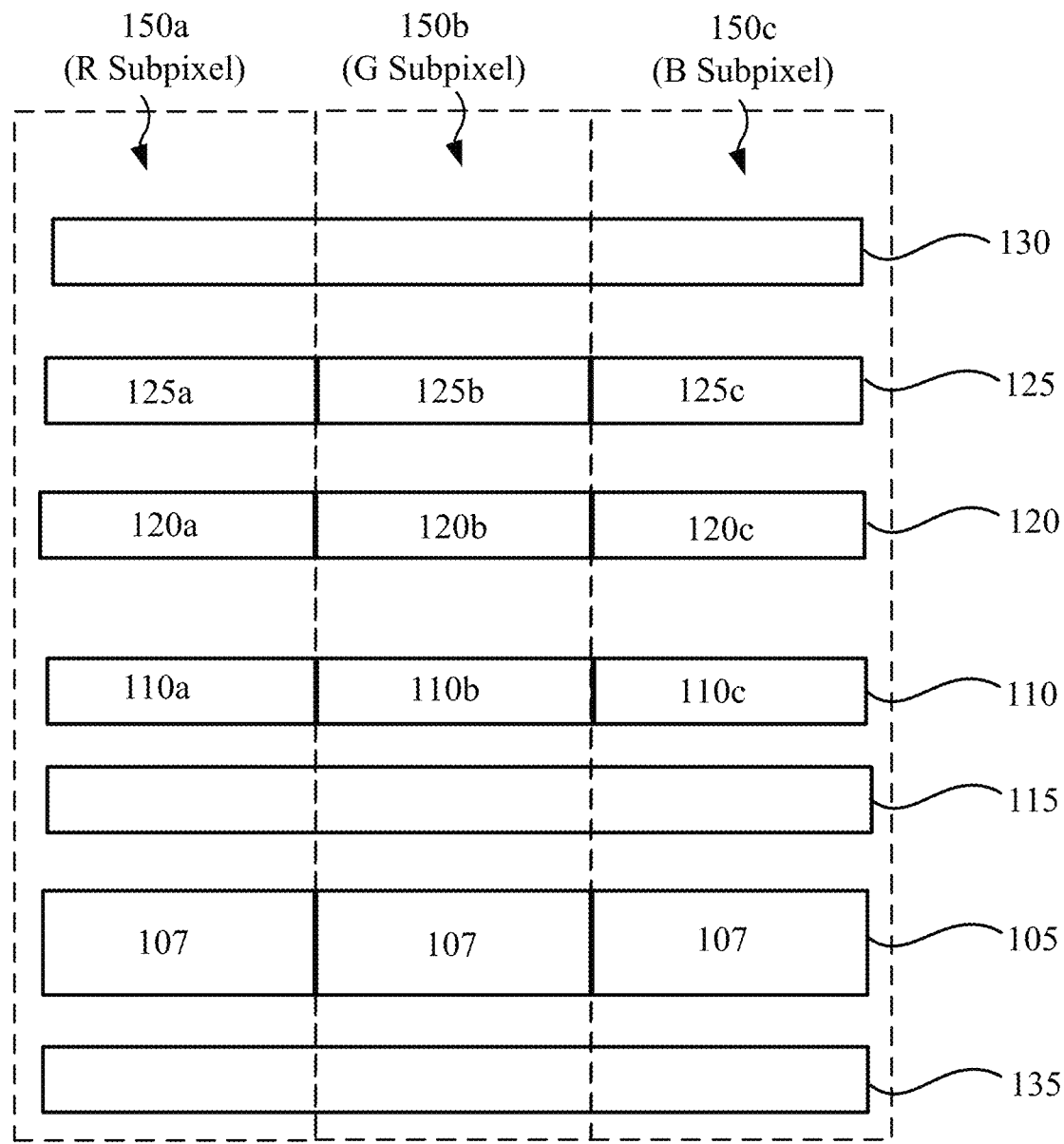
FIG. 2A schematically illustrates a display device, according to an embodiment of the present disclosure.

FIG. 2A schematically illustrates a y-z sectional view of a display device 200, according to an embodiment of the present disclosure. The display device 200 may be an emissive display device, e.g., an OLED display device, an LED display device, a micro-OLED display device, or a micro-LED display device, etc. The display device 200 may include elements that are the same as or similar to those included in the display device 100 shown in FIGS. 1A-1C. Descriptions of the same or similar elements may refer to the above descriptions rendered in connection with FIGS. 1A-1C.

For example, as shown in FIG. 2A, the display device 200 may include the display panel 105 including the light-emitting elements 107, the reflective polarizer 110, the color conversion layer 120, and the color filter layer 125. In some embodiments, the reflective polarizer 110, the color conversion layer 120, and the color filter layer 125 may be disposed at the light outputting side (e.g., the first side or surface) of the display panel 105 facing a viewer of the display device 200. In some embodiments, the reflective polarizer 110 may be disposed between the display panel 105 and the color conversion layer 120, and the color conversion layer 120 may be disposed between the reflective polarizer 110 and the color filter layer 125.

In some embodiments, the display device 200 may also include the reflector 135 disposed at the bottom of the display panel 105, e.g., disposed at the side (e.g., the second side or surface) of the display panel 105 opposing to the light outputting side at the viewer's side of the display device 200. In some embodiments, the display device 200 may also include the waveplate 115 disposed between the reflective polarizer 110 and the display panel 105. In some embodiments, the display device 200 may also include the linear polarizer 130 disposed at a light outputting side of the color filter layer 125 facing the viewer, and the color filter layer 125 may be disposed between the linear polarizer 130 and the color conversion layer 120. In the embodiment shown in FIG. 2A, the light-emitting element 107 may emit an image light of blue color, and the reflective polarizer 110 may be a linear reflective polarizer with a designed operating wavelength band within, at least partially overlapping with, or corresponding to (e.g., substantially the same as) the emission wavelength band of the light-emitting elements 107, e.g., the blue wavelength band.

Figure 2B:
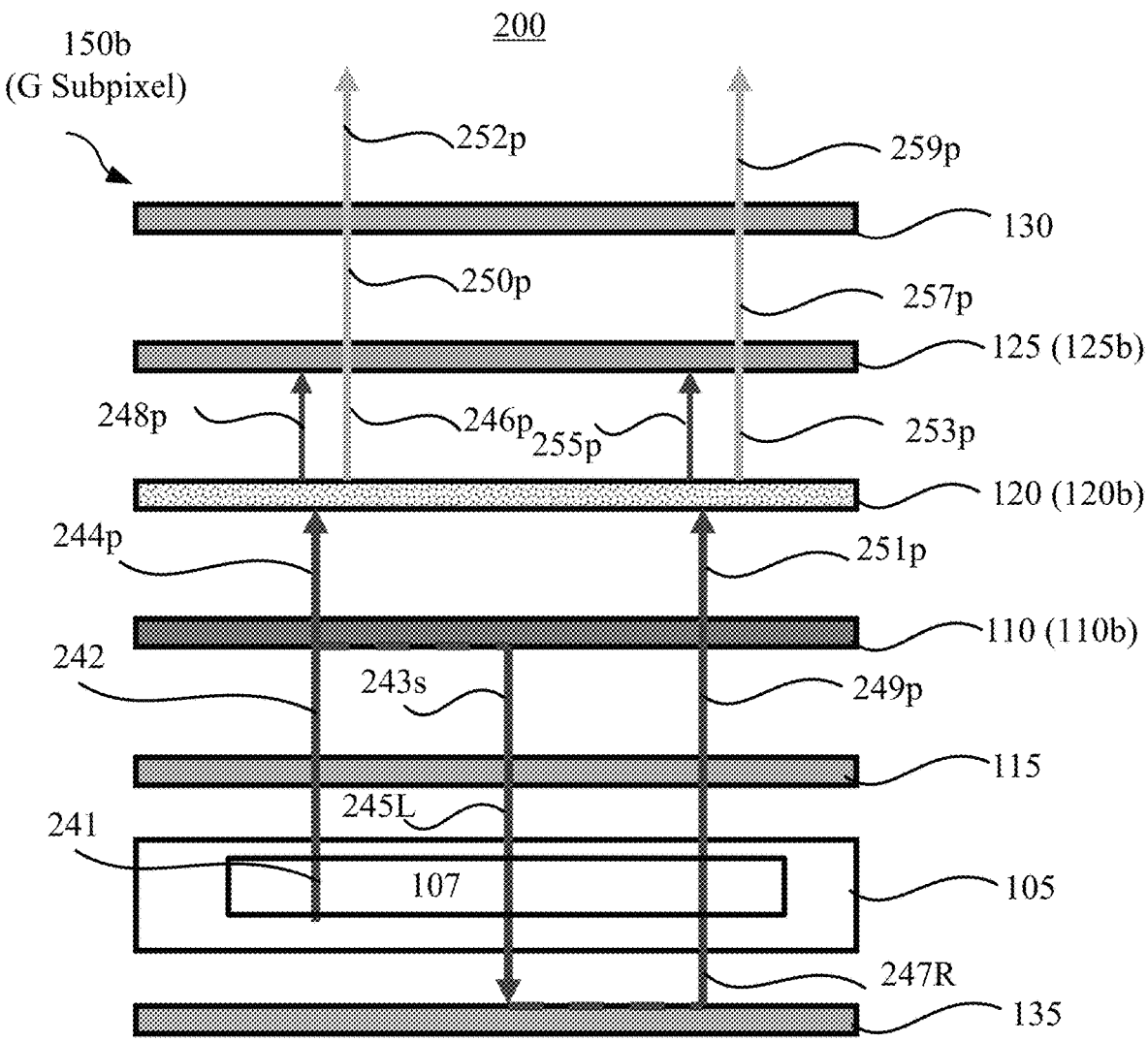
FIG. 2B schematically illustrates an optical path of an image light propagating in the display device shown in FIG. 2A, according to an embodiment of the present disclosure.
Figure 2C:
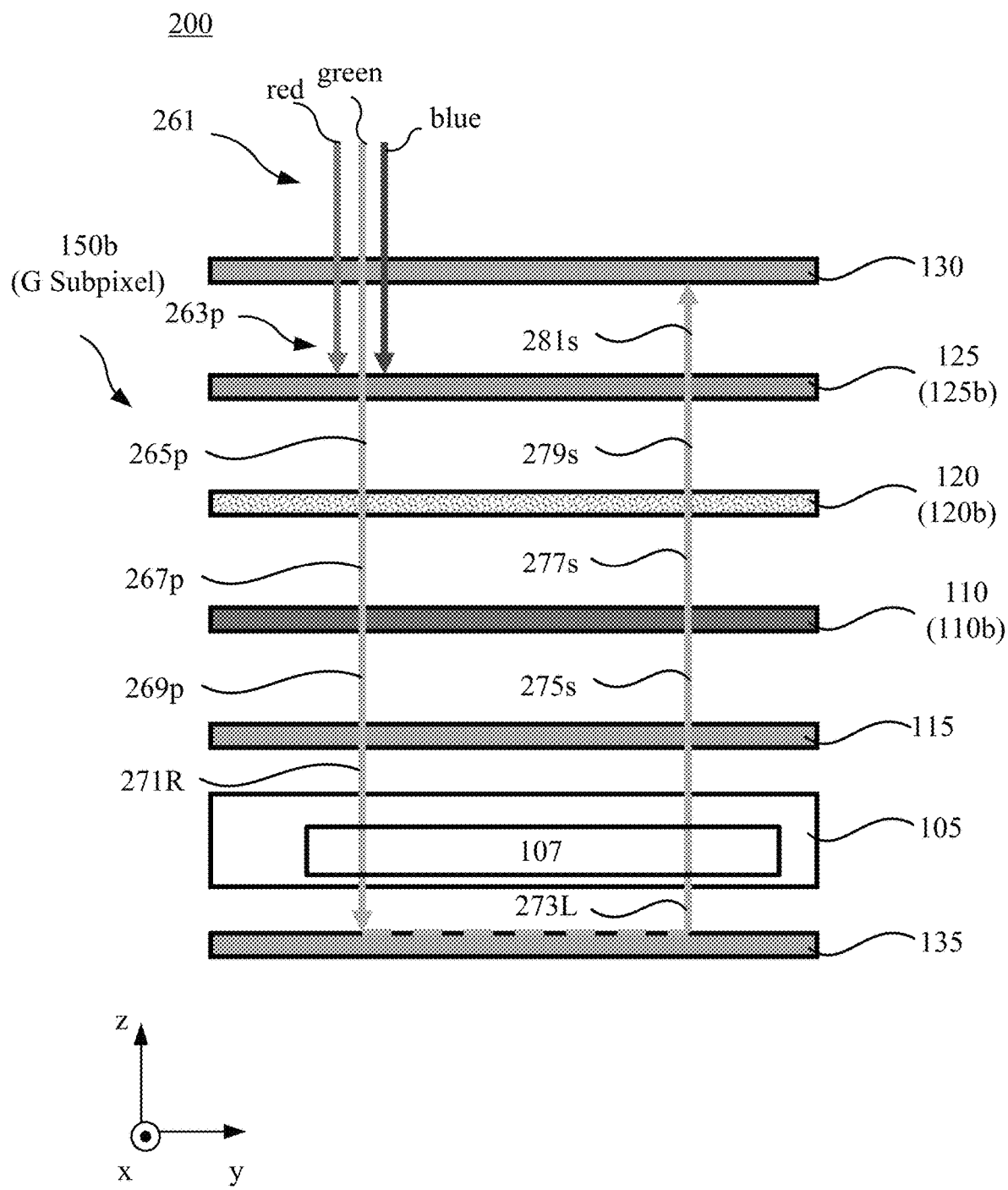
FIG. 2C schematically illustrates an optical path of an ambient light propagating in the display device shown in FIG. 2A, according to an embodiment of the present disclosure.

FIG. 2B schematically illustrates an optical path of an image light 241 propagating in the display device 200 shown in FIG. 2A, according to an embodiment of the present disclosure. FIG. 2C schematically illustrates an optical path of an ambient light 261 propagating in the display device 200 shown in FIG. 2A, according to an embodiment of the present disclosure. For discussion purposes, FIG. 2B or FIG. 2C shows a portion of the optical path of the image light 241 or the ambient light 261 propagating through a single second subpixel (e.g., green subpixel) 150b. Optical paths of the image light 241 or the ambient light 261 propagating through other subpixels (e.g., red subpixels 150a) of the display device 200 may be substantially the same as that shown in FIG. 29 or FIG. 2C. In FIG. 2B and FIG. 2C, "R" denotes a right-handed circularly polarized ("RHCP") light, "L" denotes a left-handed circularly polarized ("LHCP") light, "s" denotes an s-polarized light, and "p" denotes a p-polarized light.

For discussion purpose, in FIG. 2B, the light-emitting element 107 may emit an image light 241 that is an unpolarized, blue image light. That is, the image light 241 may be associated with a first predetermined wavelength hand, e.g., the blue wavelength band. The image light 241 may propagate in the forward direction (e.g., the +z-axis direction) toward the waveplate 115. The waveplate 115 may be configured to transmit the unpolarized image light 241 as an unpolarized image light 242 propagating toward the reflective polarizer 110. In the embodiment shown in FIG. 2B, the reflective polarizer 110 may be a linear reflective polarizer with a predetermined operating wavelength band within, at least partially overlapping with, or corresponding to (e.g., substantially the same as) the blue wavelength band. For discussion purpose, the reflective polarizer 110 may be configured to substantially reflect an s-polarized light having a wavelength within the blue wavelength band, and substantially transmit a p-polarized light having a wavelength within the blue wavelength band. For discussion purpose, the reflective polarizer 110 may substantially maintain a polarization of a polarized light while reflecting or transmitting the polarized light. As shown in FIG. 2B, the second polarizer units 110b in the reflective polarizer 110 may be configured to substantially transmit a p-polarized component of the unpolarized image light 242 as a p-polarized image light 244p propagating toward the color conversion layer 120, and substantially reflect an s-polarized component of the unpolarized image light 242 as an s-polarized image light 243s back to the waveplate 115.

The waveplate 115 may be configured to convert the s-polarized image light 243s into an LHCP image light 245L propagating toward the reflector 135. The reflector 135 may be configured to reflect the LHCP image light 245L as an RHCP image light 247R back to the waveplate 115. The waveplate 115 may be configured to convert the RHCP image light 247R into a p-polarized image light 249p propagating toward the reflective polarizer 110. The reflective polarizer 110 may substantially transmit the p-polarized image light 249p as a p-polarized image light 251p propagating toward the color conversion layer 120.

The second color conversion unit 120b in the color conversion layer 120 may be configured to convert the p-polarized image lights 244p and 251p of blue color into p-polarized image lights 246p and 253p of green color, respectively. For example, the second color conversion units 120b may include the second color conversion material configured to absorb the p-polarized image lights 244p and 251p of blue color, and emit the p-polarized image lights 246p and 253p of green color. That is, the p-polarized image lights 246p and 253p may be associated with a second predetermined wavelength band, e.g., the green wavelength band. In some embodiments, the p-polarized image lights 244p and 251p of blue color may not be fully converted into the p-polarized image lights 246p and 253p of green color by the second color conversion unit 120b. In some embodiments, a portion of the p-polarized image lights 244p and 251p of blue color may be transmitted through the second color conversion unit 120b as p-polarized image lights 248p and 255p of blue color. The p-polarized image lights 246p and 253p of green color, and the p-polarized image lights 248p and 255p of blue color may propagate toward the color filter layer 125.

The second color filter (e.g., green color filter) 125b in the color filter layer 125 may be configured to substantially transmit the p-polarized lights 246p and 253p of green color as p-polarized image lights 250p and 257p propagating toward the linear polarizer 130, and substantially block the p-polarized image lights 248p and 255p of blue color. The linear polarizer 130 may be configured to substantially transmit a p-polarized light and substantially block an s-polarized light. Thus, the p-polarized image lights 250p and 257p of green color may be transmitted through the linear polarizer 130 as p-polarized image lights 252p and 259p of green color, which may be perceived by a viewer of the display device 200.

Due to the polarization selectivity of the reflective polarizer 110 and the polarization reversion of the reflector 135, a polarization recirculation of the image light 241 emitted from the light-emitting element 107 may be achieved, which may significantly increase the light transmission efficiency of the display device 200. Accordingly, the power efficiency of the display device 200 may be significantly improved.

Referring to FIGS. 2A and 2B, the optical path of the image light 241 propagating through other subpixels (e.g., red subpixels 150a) of the display device 200 may be substantially the same as that shown in FIG. 2B. For example, the image light 241 propagating through the red subpixels 150a may be output as a p-polarized image light of red color from the linear polarizer 130. The image light 241 propagating through the blue-subpixels 150c of the display device 200 may not be subject to the polarization-selective reflection or transmission of the reflective polarizer 110, as the third polarizer units 110c corresponding to the third (e.g., blue) subpixels 150c may not include any sub-reflective polarizer. Instead, the image light 241 of the blue color may be directly transmitted through the third polarizer units 110c of the reflective polarizer 110. In addition, the image light 241 propagating through the blue-subpixels 150c of the display device 200 may not be subject to the color conversion process of the color conversion layer 120, as the third color conversion units 120c corresponding to the third (e.g., blue) subpixels 150c may not include a color conversion material. Instead, the image light 241 of the blue color may be directly transmitted through the third color conversion units 120c of the color conversion layer 120. The image light 241 propagating through the blue-subpixels 150c of the display device 200 may be output as a p-polarized image light of blue color from the linear polarizer 130. Thus, the display device 200 may display full color images with enhanced brightness.

As shown in FIG. 2C, the ambient light 261 may be a polychromatic visible light including a red portion, a green portion, and a blue portion. For discussion purposes, the ambient light 261 may be an unpolarized light. The linear polarizer 130 may be configured to convert the ambient light 261 into a p-polarized light 263p propagating toward the color filter layer 125. The second color filter (e.g., green color filter) 125b in the color filter layer 125 may be configured to substantially transmit the green portion of the p-polarized light 263p as a p-polarized light 265p of green color propagating toward the color conversion layer 120, and substantially block the red and blue portions of the p-polarized light 263p. The second color conversion unit 120b in the color conversion layer 120 may be configured to substantially transmit the p-polarized light 265p of green color as a p-polarized light 267p of green color propagating toward the reflective polarizer 110. The second polarizer unit 110b in the reflective polarizer 110 with a designed operating wavelength band within, at least partially overlapping with, or corresponding to (e.g., substantially the same as) the blue wavelength band may transmit the p-polarized light 267p of green color as a p-polarized light 269p of green color propagating toward the waveplate 115. The waveplate 115 may be configured to convert the p-polarized light 269p of green color into an RHCP light 271R of green color propagating toward the display panel 105 and the reflector 135.

The reflector 135 may be configured to reflect the RHCP light 271R of green color as an LHCP light 273L of green color back to the display panel 105, and to the waveplate 115. The waveplate 115 may be configured to convert the LHCP light 273L of green color into an s-polarized light 275s of green color propagating toward the reflective polarizer 110. The second polarizer unit 110b in the reflective polarizer 110 with a designed operating wavelength band within, at least partially overlapping with, or corresponding to (e.g., substantially the same as) the blue wavelength band may transmit the s-polarized light 275s of green color as an s-polarized light 277s of green color propagating toward the color conversion layer 120. The second color conversion unit 120b in the color conversion layer 120 may be configured to substantially transmit the s-polarized light 277s of green color as an s-polarized light 279s of green color propagating toward the color filter layer 125. The second color filter (e.g., green color filter) 125b in the color filter layer 125 may be configured to substantially transmit the s-polarized light 279s of green color as an s-polarized light 281s of green color propagating toward the linear polarizer 130. The linear polarizer 130 may block, via absorption, the s-polarized light 281s of green color from being output out of the display device 200.

Due to the color selective absorption of the color filter layer 125 and the polarization reversion of the reflector 135, the red and blue portions of the ambient light 261 may be absorbed by the second color filters (e.g., green color filters) 125b in the color filter layer 125, and the green portion of the ambient light 261 after reflected by the reflector 135, may be absorbed by the linear polarizer 130. Referring to FIG. 2A and FIG. 2C, the optical path of the ambient light 261 propagating through other subpixels (e.g., red subpixels 150a, blue-subpixels 150c) of the display device 200 may be substantially the same as that shown in FIG. 2C. For example, the ambient light 261 propagating through the red subpixels 150a and the blue-subpixels 150c may be converted to an s-polarized light of red color and an s-polarized light of blue color, which may be blocked by the linear polarizer 130 from being output from the display device 200. Thus, the reflection of the ambient light 261 from the reflector 135 may be reduced. The ambient light 261 reflected by the display device 200 may not be perceived by the viewer of the display device 200. The contrast ratio of the display device 200 may be significantly increased, and the image performance of the display device 200 may be significantly enhanced.

Figure 3A:
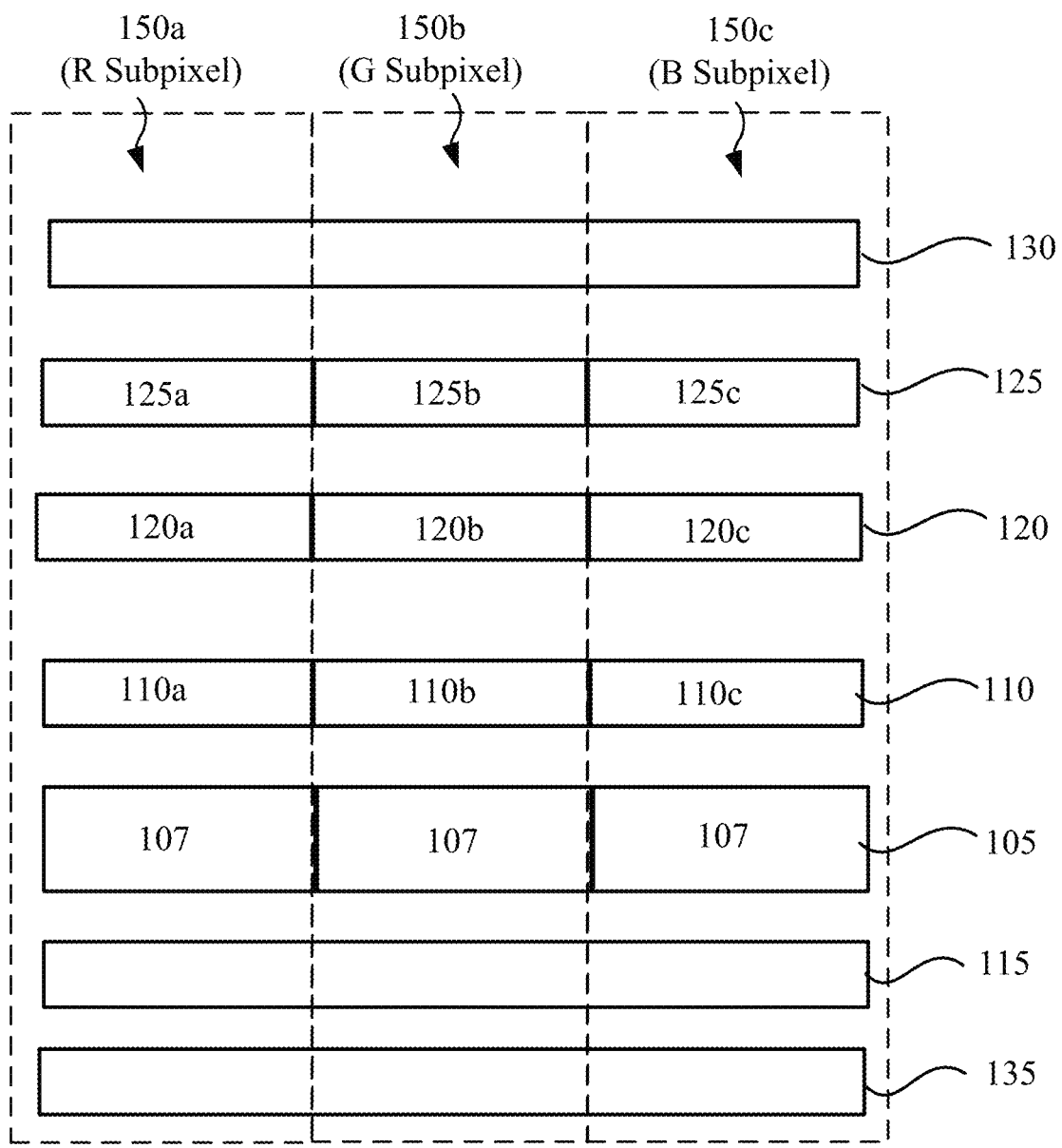
FIG. 3A schematically illustrates a display device, according to an embodiment of the present disclosure.

FIG. 3A schematically illustrates a y-z sectional view of a display device 300, according to an embodiment of the present disclosure. The display device 300 may be an emissive display device, e.g., an OLED display device, an LED display device, a micro-OLED display device, or a micro-LED display device, etc. The display device 300 may include elements that are the same as or similar to those included in the display device 100 shown in FIGS. 1A-1C, or the display device 200 shown in FIGS. 2A-2C. Descriptions of the same or similar elements may refer to the above descriptions rendered in connection with FIGS. 1A-1C, or FIGS. 2A-2C.

For example, as shown in FIG. 3A, the display device 300 may include the display panel 105 including the light-emitting elements 107, the reflective polarizer 110, the color conversion layer 120, and the color filter layer 125. In some embodiments, the reflective polarizer 110, the color conversion layer 120, and the color filter layer 125 may be disposed at the light outputting side (e.g., the first side or surface) of the display panel 105 facing a viewer of the display device 300. In some embodiments, the reflective polarizer 110 may be disposed between the display panel 105 and the color conversion layer 120, and the color conversion layer 120 may be disposed between the reflective polarizer 110 and the color filter layer 125.

In some embodiments, the display device 300 may also include the reflector 135 disposed at the bottom of the display panel 105, e.g., disposed at the side (e.g., the second side or surface) of the display panel 105 opposite to the light outputting side (e.g., the first side or surface) at the viewer's side of the display device 300. In some embodiments, the display device 300 may also include the waveplate 115 disposed at the second side or surface of the display panel 105, and disposed between the reflector 135 and the display panel 105. In some embodiments, the display device 300 may also include the linear polarizer 130 disposed on top of the color filter layer 125, and the color filter layer 125 may be disposed between the linear polarizer 130 and the color conversion layer 120. In the embodiment shown in FIG. 3A, the light-emitting element 107 may emit an image light of blue color, and the reflective polarizer 110 may be a linear reflective polarizer with a designed operating wavelength band within, at least partially overlapping with, or corresponding to (e.g., substantially the same as) the emission wavelength band of the light-emitting elements 107, e.g., the blue wavelength band.

Figure 3B:
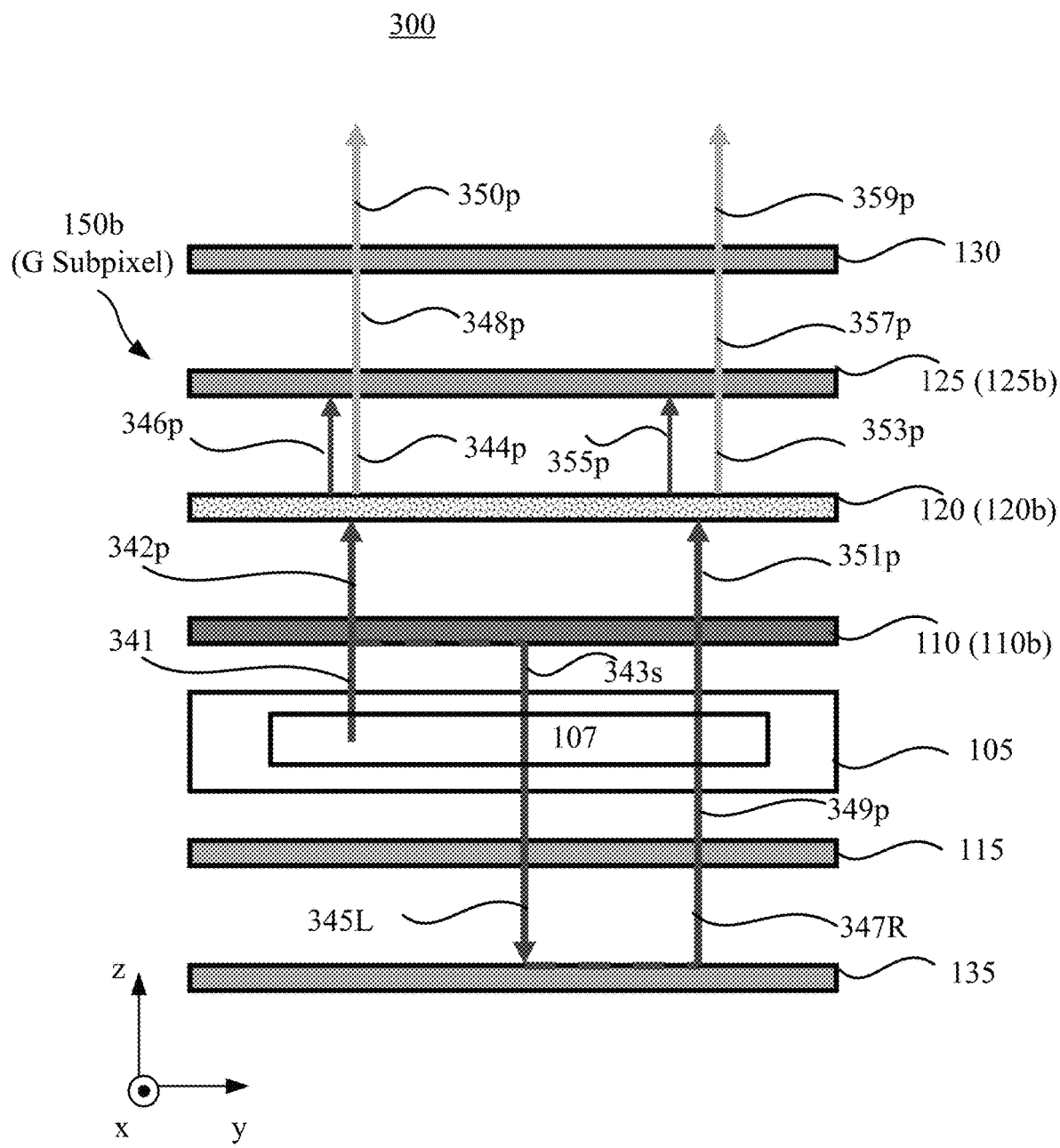
FIG. 3B schematically illustrates an optical path of an image light propagating in the display device shown in FIG. 3A, according to an embodiment of the present disclosure.
Figure 3C:
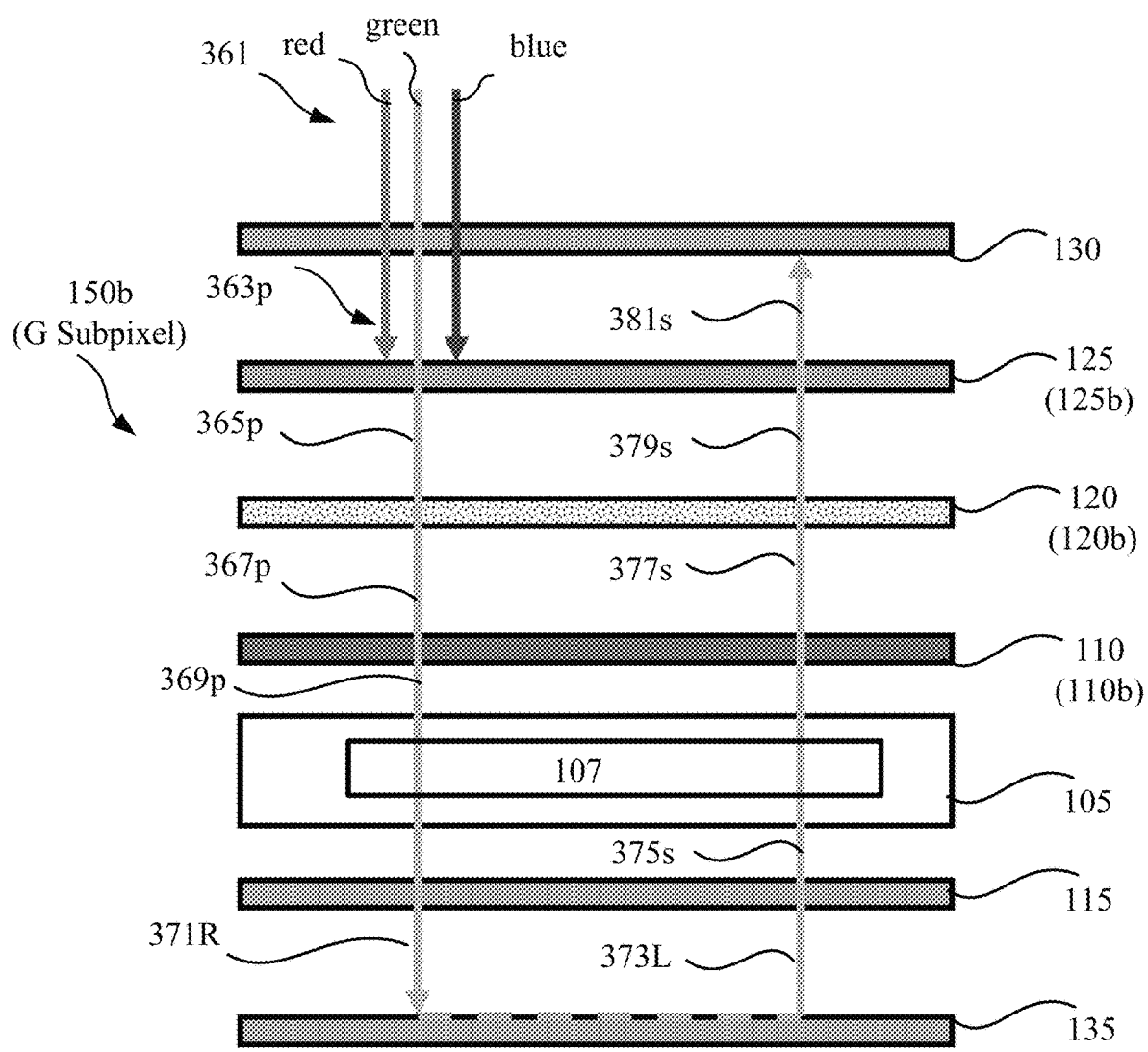
FIG. 3C schematically illustrates an optical path of an ambient light propagating in the display device shown in FIG. 3A, according to an embodiment of the present disclosure.

FIG. 3B schematically illustrates an optical path of an image light 341 propagating in the display device 300 shown in FIG. 3A, according to an embodiment of the present disclosure. FIG. 3C schematically illustrates an optical path of an ambient light 361 propagating in the display device 300 shown in FIG. 3A, according to an embodiment of the present disclosure. For discussion purposes, FIG. 3B or FIG. 3C shows a portion of the optical path of the image light 341 or the ambient light 361 propagating through a single second subpixel (e.g., green subpixel) 150b. Optical paths of the image light 341 or the ambient light 361 propagating through other subpixels (e.g., red subpixels 150a) of the display device 300 may be substantially the same as that shown in FIG. 3B or FIG. 3C. In FIG. 3B and FIG. 3C, "R" denotes a right-handed circularly polarized ("RHCP") light, "L" denotes a left-handed circularly polarized ("LHCP") light, "s" denotes an s-polarized light, and "p" denotes a p-polarized light.

For discussion purpose, in FIG. 3B, the light-emitting element 107 may emit an image light 341 that is an unpolarized blue image light. That is, the image light 341 may be associated with a first predetermined wavelength band, e.g., the blue wavelength band. The image light 341 may propagate in the forward direction toward the reflective polarizer 110. In the embodiment shown in FIG. 3B, the reflective polarizer 110 may be a linear reflective polarizer with a designed operating wavelength band within, at least partially overlapping with, or corresponding to (e.g., substantially the same as) the blue wavelength band. For discussion purpose, the reflective polarizer 110 may be configured to substantially reflect an s-polarized light of the blue wavelength band, and substantially transmit a p-polarized light of the blue wavelength band. For discussion purpose, the reflective polarizer 110 may substantially maintain a polarization of a polarized light while reflecting or transmitting the polarized light. As shown in FIG. 3B, the second polarizer units 110b in the reflective polarizer 110 may be configured to substantially transmit a p-polarized component of the unpolarized image light 341 as a p-polarized image light 342p propagating toward the color conversion layer 120, and substantially reflect an s-polarized component of the unpolarized image light 341 as an s-polarized image light 343s to the display panel 105 and the waveplate 115.

The waveplate 115 may be configured to convert the s-polarized image light 343s into an LHCP image light 345L propagating toward the reflector 135. The reflector 135 may be configured to reflect the LHCP image light 345L as an RHCP image light 347R back to the waveplate 115. The waveplate 115 may be configured to convert the RHCP image light 347R into a p-polarized image light 349p propagating toward the display panel 105 and the reflective polarizer 110. The reflective polarizer 110 may substantially transmit the p-polarized image light 349p as a p-polarized image light 351p propagating toward the color conversion layer 120.

The second color conversion unit 120b in the color conversion layer 120 may be configured to convert the p-polarized image lights 342p and 351p of blue color into p-polarized image lights 344p and 353p of green color, respectively. For example, the second color conversion units 120b may include the second color conversion material configured to absorb the p-polarized image lights 342p and 351p of blue color and emit the p-polarized image lights 344p and 353p of green color. In some embodiments, the p-polarized image lights 342p and 351p of blue color may not be fully converted into the p-polarized image lights 344p and 353p of green color by the second color conversion unit 120b. In some embodiments, a portion of the p-polarized image lights 342p and 351p of blue color may be transmitted through the second color conversion unit 120b as p-polarized image lights 346p and 355p of blue color. The p-polarized image lights 344p and 353p of green color, and the p-polarized image lights 346p and 355p of blue color may propagate toward the color filter layer 125.

The second color filter (e.g., green color filter) 125b in the color filter layer 125 may be configured to substantially transmit the p-polarized lights 344p and 353p of green color as p-polarized image lights 348p and 357p propagating toward the linear polarizer 130, and substantially block the p-polarized image lights 346p and 355p of blue color. The linear polarizer 130 may be configured to substantially transmit a p-polarized light and substantially block an s-polarized light. Thus, the p-polarized image lights 348p and 357p of green color may be transmitted through the linear polarizer 130 as p-polarized image lights 350p and 359p of green color, which may be perceived by a viewer of the display device 300.

Due to the polarization selectivity of the reflective polarizer 110 and the polarization reversion of the reflector 135, a polarization recirculation of the image light 341 emitted from the light-emitting element 107 may be achieved, which may significantly increase the light transmission efficiency of the display device 100. Accordingly, the power efficiency of the display device 300 may be significantly increased.

Referring to FIGS. 3A and 3B, the optical path of the image light 341 propagating through other subpixels (e.g., red subpixels 150a) of the display device 300 may be substantially the same as that shown in FIG. 3B. For example, the image light 341 propagating through the red subpixels 150a may be output as a p-polarized image light of red color from the linear polarizer 130. The image light 341 propagating through the blue-subpixels 150c of the display device 300 may not be subject to the polarization-selective reflection or transmission of the reflective polarizer 110, as the third polarizer units 110c corresponding to the third (e.g., blue) subpixels 150c may not include any sub-reflective polarizer. Instead, the image light 341 of the blue color may be directly transmitted through the third polarizer units 110c of the reflective polarizer 110. In addition, the image light 341 propagating through the blue-subpixels 150c of the display device 300 may not be subject to the color conversion process of the color conversion layer 120, as the third color conversion units 120c corresponding to the third (e.g., blue) subpixels 150c may not include a color conversion material. Instead, the image light 341 of the blue color may be directly transmitted through the third color conversion units 120c of the color conversion layer 120. The image light 341 propagating through the blue-subpixels 150c of the display device 300 may be output as a p-polarized image light of blue color from the linear polarizer 130. Thus, the display device 300 may display full color images with enhanced brightness.

As shown in FIG. 3C, the ambient light 361 may be a polychromatic visible light including a red portion, a green portion, and a blue portion. For discussion purposes, the ambient light 361 may be an unpolarized light. The linear polarizer 130 may be configured to convert the ambient light 361 into a p-polarized light 363b propagating toward the color filter layer 125. The second color filter (e.g., green color filter) 125b in the color filter layer 125 may be configured to substantially transmit the green portion of the p-polarized light 363p as a p-polarized light 365p of green color propagating toward the color conversion layer 120, and substantially block the red and blue portions of the p-polarized light 363p. The second color conversion unit 120b in the color conversion layer 120 may be configured to substantially transmit the p-polarized light 365p of green color as a p-polarized light 367p of green color propagating toward the reflective polarizer 110. The second polarizer unit 110b in the reflective polarizer 110 with a designed operating wavelength band within, at least partially overlapping with, or corresponding to (e.g., substantially the same as) the blue wavelength band may transmit the p-polarized light 367p of green color as a p-polarized light 369p of green color propagating toward the display panel 105 and the waveplate 115. The waveplate 115 may be configured to convert the p-polarized light 369p of green color into an RHCP light 371R of green color propagating toward the reflector 135.

The reflector 135 may be configured to reflect the RHCP light 371R of green color as an LHCP light 373L of green color back to the waveplate 115. The waveplate 115 may be configured to convert the LHCP light 373L of green color into an s-polarized light 375s of green color propagating toward the display panel 105 and the reflective polarizer 110. The second polarizer unit 110b in the reflective polarizer 110 with a designed operating wavelength band within, at least partially overlapping with, or corresponding to (e.g., substantially the same as) the blue wavelength band may transmit the s-polarized light 375s of green color as an s-polarized light 377s of green color propagating toward the color conversion layer 120. The second color conversion unit 120b in the color conversion layer 120 may be configured to substantially transmit the s-polarized light 377s of green color as an s-polarized light 379s of green color propagating toward the color filter layer 125. The second color filter (e.g., green color filter) 125b in the color filter layer 125 may be configured to substantially transmit the s-polarized light 379s of green color as an s-polarized light 381s of green color propagating toward the linear polarizer 130. The linear polarizer 130 may block, via absorption, the s-polarized light 381s of green color from being output from the display device 300.

Due to the color selective absorption of the color filter layer 125 and the polarization reversion of the reflector 135, the red and blue portions of the ambient light 361 may be absorbed by the second color filters (e.g., green color filters) 125b in the color filter layer 125, and the green portion of the ambient light 361 after reflected by the reflector 135, may be absorbed by the linear polarizer 130. Referring to FIG. 3A and FIG. 3C, the optical path of the ambient light 361 propagating through other subpixels (e.g., red subpixels 150a, blue-subpixels 150c) of the display device 300 may be substantially the same as that shown in FIG. 3C. For example, the ambient light 361 propagating through the red subpixels 150a and the blue-subpixels 150c may be converted to an s-polarized light of red color and an s-polarized light of blue color, which may be blocked by the linear polarizer 130 from being output from the display device 300. Thus, the reflection of the ambient light 361 from the reflector 135 may be reduced. The ambient light 361 falling on the display device 300 may not be perceived by the viewer of the display device 300. The contrast ratio of the display device 300 may be significantly improved, and the image performance of the display device 300 may be significantly enhanced.

Figure 4A:
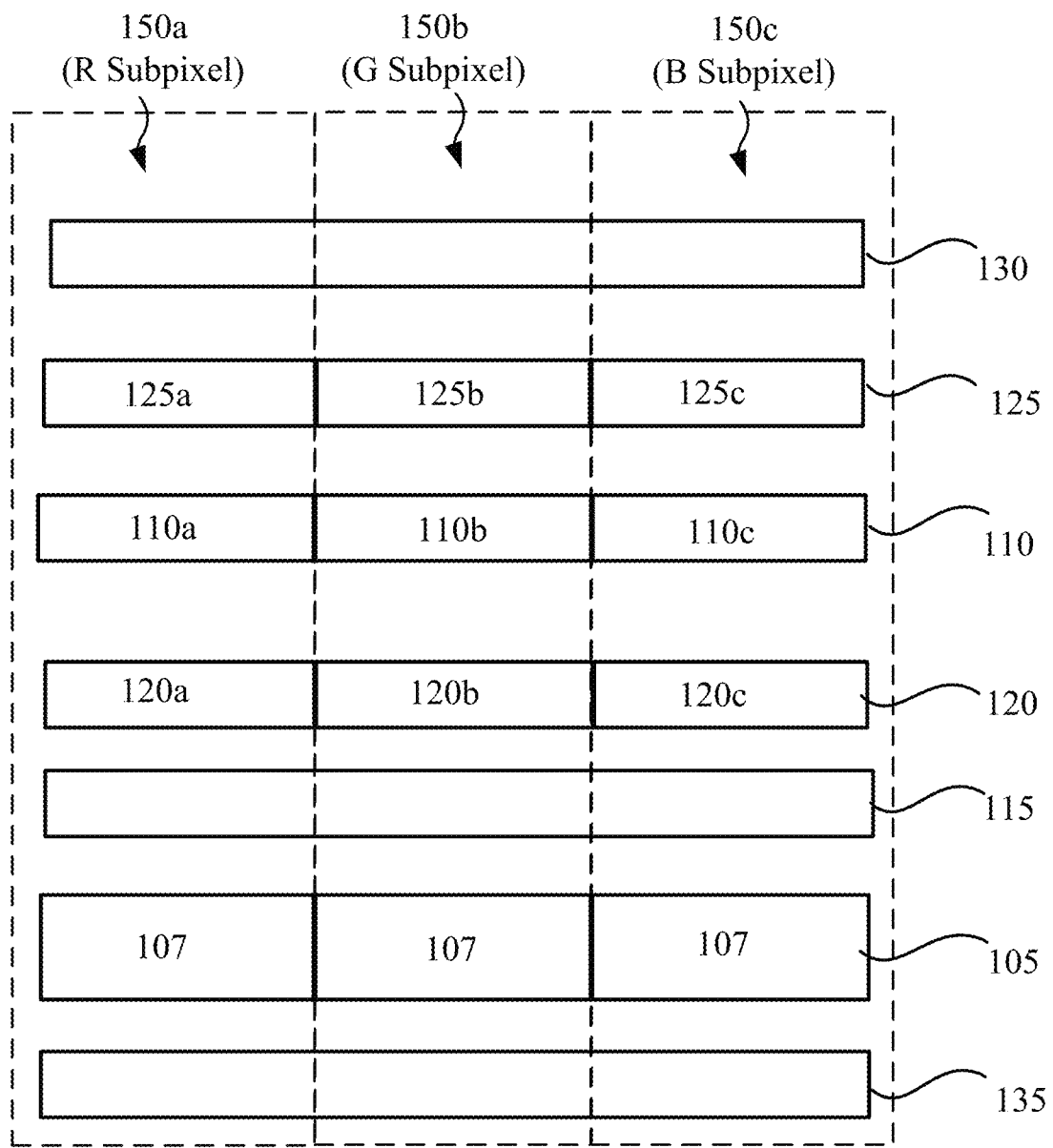
FIG. 4A schematically illustrates a display device, according to an embodiment of the present disclosure.

FIG. 4A schematically illustrates a y-z sectional view of a display device 400, according to an embodiment of the present disclosure. The display device 400 may be an emissive display device, e.g., an OLED display device, an LED display device, a micro-OLED display device, or a micro-LED display device, etc. The display device 400 may include elements that are the same as or similar to those included in the display device 100 shown in FIGS. 1A-1C, the display device 200 shown in FIGS. 2A-2C, or the display device 300 shown in FIGS. 3A-3C. Descriptions of the same or similar elements may refer to the above descriptions rendered in connection with FIGS. 1A-1C, FIGS. 2A-2C, or FIGS. 3A-3C. For example, as shown in FIG. 4A, the display device 400 may include the display panel 105 including the light-emitting elements 107, the color conversion layer 120, the reflective polarizer 110, and the color filter layer 125. In some embodiments, the color conversion layer 120, the reflective polarizer 110, and the color filter layer 125 may be disposed at the side (e.g., the first side or surface) of the display panel 105 facing a viewer of the display device 400. In the embodiment shown in FIG. 4A, the reflective polarizer 110 may be disposed between the color conversion layer 120 and the color filter layer 125, and the color conversion layer 120 may be disposed between the reflective polarizer 110 and the display panel 105.

In some embodiments, the display device 400 may also include the reflector 135 disposed at the bottom of the display panel 105, e.g., disposed at the side (e.g., the second side or surface) of the display panel 105 opposite to the light outputting side (e.g., the first side or surface) at the viewer's side of the display device 400. In some embodiments, the display device 400 may also include the waveplate 115 disposed between the color conversion layer 120 and the display panel 105. In some embodiments, the display device 400 may also include the linear polarizer 130 disposed at a light outputting side (e.g., viewer's side) of the color filter layer 125, and the color filter layer 125 may be disposed between the linear polarizer 130 and the reflective polarizer 110. In the embodiment shown in FIG. 4A, the light-emitting element 107 may emit an image light of blue color, and the reflective polarizer 110 may be a linear reflective polarizer with a designed operating wavelength band within, at least partially overlapping with, or corresponding to (e.g., substantially the same as) the emission wavelength band of the light-emitting elements 107, e.g., the blue wavelength band.

Figure 4B:
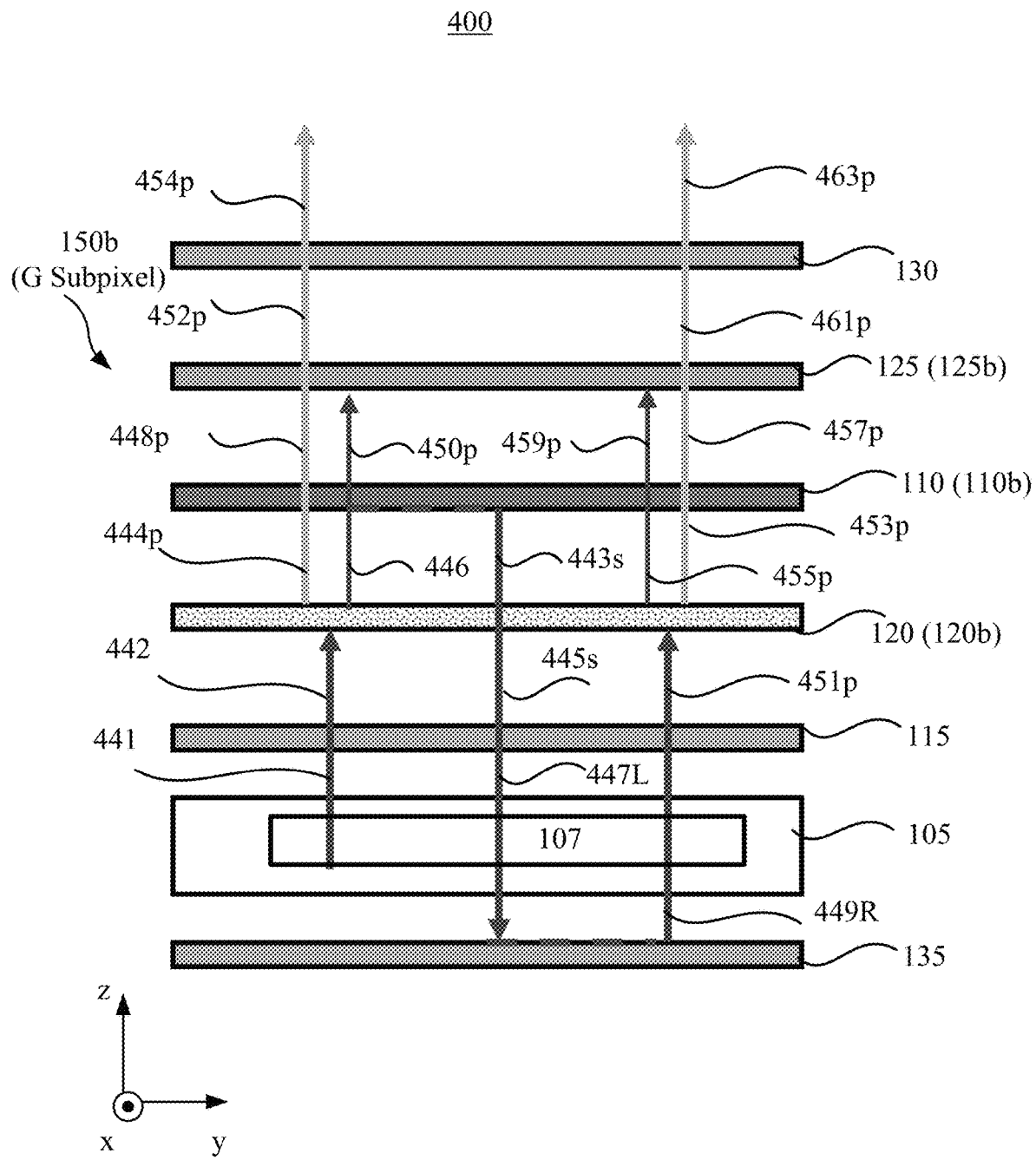
FIG. 4B schematically illustrates an optical path of an image light propagating in the display device shown in FIG. 4A, according to an embodiment of the present disclosure.
Figure 4C:
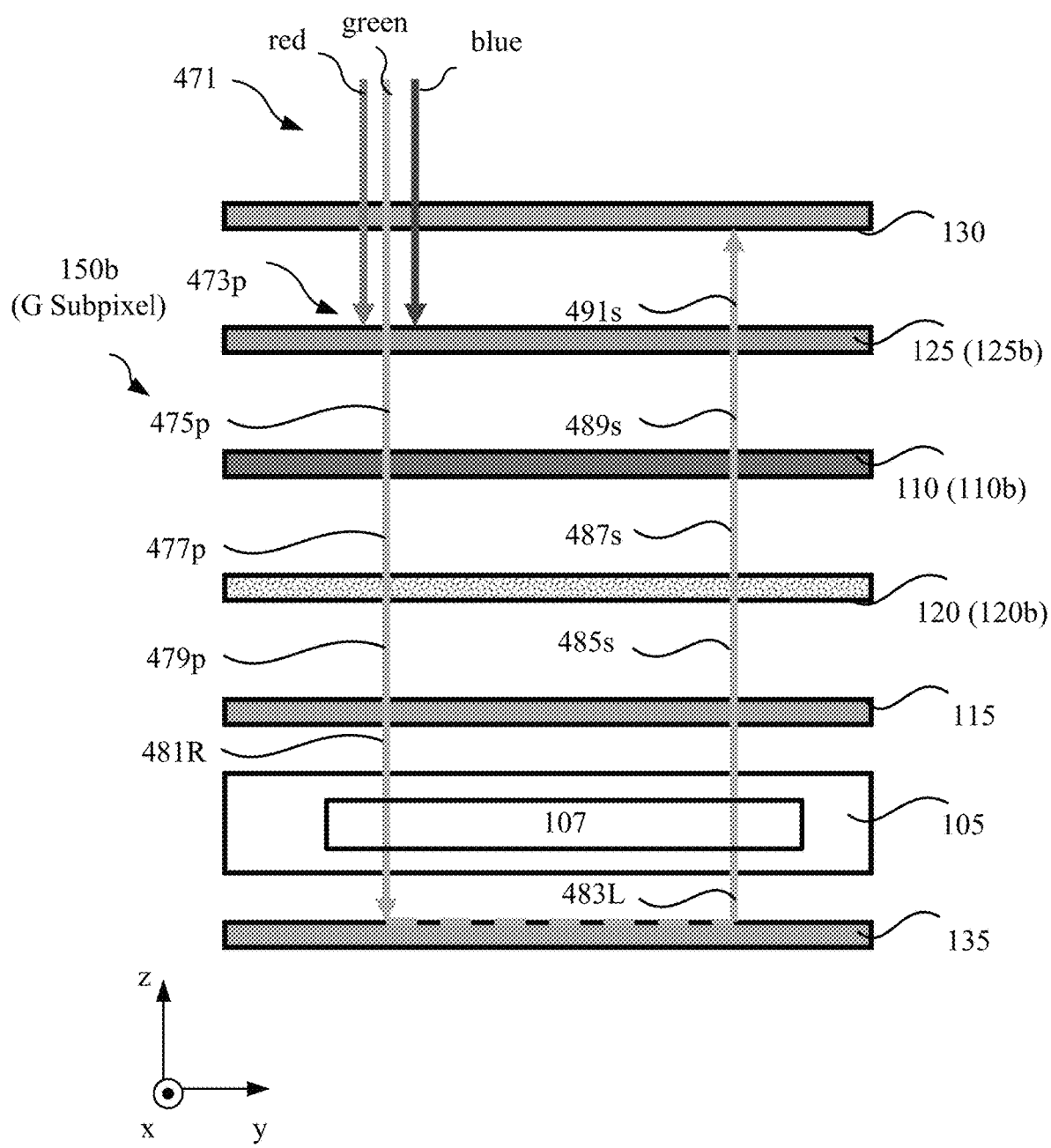
FIG. 4C schematically illustrates an optical path of an ambient light propagating in the display device shown in FIG. 4A, according to an embodiment of the present disclosure.

FIG. 4B schematically illustrates an optical path of an image light 441 propagating in the display device 400 shown in FIG. 4A, according to an embodiment of the present disclosure. FIG. 4C schematically illustrates an optical path of an ambient light 471 propagating in the display device 400 shown in FIG. 4A, according to an embodiment of the present disclosure. For discussion purposes, FIG. 4B or FIG. 4C shows a portion of the optical path of the image light 441 or the ambient light 471 propagating through a single second subpixel (e.g., green subpixel) 150b. Optical paths of the image light 441 or the ambient light 471 propagating through other subpixels (e.g., red subpixels 150a) of the display device 400 may be substantially the same as that shown in FIG. 4B or FIG. 4C. In FIG. 4B and FIG. 4C, "R" denotes a right-handed circularly polarized ("RHCP") light, "L" denotes a left-handed circularly polarized ("LHCP") light, "s" denotes an s-polarized light, and "p" denotes a p-polarized light.

For discussion purpose, in FIG. 4B, the light-emitting element 107 may emit an image light 441 that is an unpolarized blue image light. That is, the image light 441 may be associated with a first predetermined wavelength band, e.g., the blue wavelength band. The image light 441 may propagate in the forward direction toward the waveplate 115. The waveplate 115 may be configured to transmit the unpolarized image light 441 as an unpolarized image light 442 propagating toward the color conversion layer 120. The second color conversion unit 120b in the color conversion layer 120 may be configured to convert the unpolarized image light 442 of blue color into a p-polarized image light 444p of green color. That is, the image light 444p may be associated with a second wavelength band, e.g., the green wavelength band. For example, the second color conversion units 120b may include the second color conversion material configured to absorb the unpolarized image light 442 of blue color and emit the p-polarized image light 444p of green color. In some embodiments, the unpolarized image light 442 of blue color may not be fully converted into the p-polarized image light 444p of green color by the second color conversion unit 120b. In some embodiments, a portion of the unpolarized image light 442 of blue color may be transmitted through the second color conversion unit 120b as an unpolarized image light 446 of blue color. The p-polarized image light 444p of green color and the unpolarized image light 446 of blue color may propagate toward the reflective polarizer 110.

In the embodiment shown in FIG. 4B, the reflective polarizer 110 may be a linear reflective polarizer with a designed operating wavelength band within, at least partially overlapping with, or corresponding to (e.g., substantially the same as) the blue wavelength band. For discussion purpose, the reflective polarizer 110 may be configured to substantially reflect an s-polarized light of the blue wavelength band, and substantially transmit a p-polarized light of the blue wavelength band. For discussion purpose, the reflective polarizer 110 may substantially maintain a polarization of a polarized light while reflecting or transmitting the polarized light. As shown in FIG. 4B, the second polarizer units 110b in the reflective polarizer 110 may be configured to substantially transmit the p-polarized image light 444p of green color as a p-polarized image light 448p of green color. In addition, the second polarizer units 110b in the reflective polarizer 110 may be configured to substantially transmit a p-polarized component of the unpolarized image light 446 of blue color as a p-polarized image light 450p of blue color propagating toward the color filter layer 125, and substantially reflect an s-polarized component of the unpolarized image light 446 of blue color as an s-polarized image light 443s of blue color back to the color conversion layer 120.

The second color conversion unit 120b in the color conversion layer 120 may be configured to convert the s-polarized image light 443s of blue color into an image light of green color (not shown) in any suitable polarization (e.g., s-polarization, or p-polarization, etc.). In some embodiments, the s-polarized image light 443s of blue color may not be fully converted into the image light of green color (not shown) by the second color conversion unit 120b. In some embodiments, a portion of the s-polarized image light 443s of blue color may be transmitted through the second color conversion unit 120b as an s-polarized image light 445s of blue color. The s-polarized image light 445s of blue color may propagate toward the waveplate 115.

The waveplate 115 may be configured to convert the s-polarized image light 445s of blue color into an LHCP image light 447L of blue color propagating toward the display panel 105 and the reflector 135. The reflector 135 may be configured to reflect the LHCP image light 447L of blue color as an RHCP image light 449R of blue color back to the display panel 105 and the waveplate 115. The waveplate 115 may be configured to convert the RHCP image light 449R of blue color into a p-polarized image light 451p of blue color propagating toward the color conversion layer 120.

The second color conversion unit 120b in the color conversion layer 120 may be configured to convert the p-polarized image light 451p of blue color into a p-polarized image light 453p of green color. That is, the p-polarized image light 453p may be associated with a second predetermined wavelength band, e.g., the green wavelength band. In some embodiments, the p-polarized image light 451p of blue color may not be fully converted into the p-polarized image light 453p of green color by the second color conversion unit 120b. In some embodiments, a portion of the p-polarized image light 451p of blue color may be transmitted through the second color conversion unit 120b as a p-polarized image light 455p of blue color.

The p-polarized image light 453p of green color and the p-polarized image light 455p of blue color may propagate toward the reflective polarizer 110. The second polarizer units 110b in the reflective polarizer 110 may be configured to substantially transmit the p-polarized image light 453p of green color and the p-polarized image light 455p of blue color as a p-polarized image light 457p of green color and a p-polarized image light 459p of blue color, respectively. The p-polarized image light 457p of green color and the p-polarized image light 459p of blue color may propagate toward the color filter layer 125.

The second color filter (e.g., green color filter) 125b in the color filter layer 125 may be configured to substantially transmit the p-polarized image light 457p of green color as p-polarized image light 461p of green color, and substantially transmit the p-polarized image light 448p of green color as a p-polarized image light 452p of green color. The second color filter (e.g., green color filter) 125b in the color filter layer 125 may be configured to substantially block the p-polarized image light 459p of blue color and the p-polarized image light 450p of blue color.

The linear polarizer 130 may be configured to substantially transmit a p-polarized light and substantially block an s-polarized light. Thus, the linear polarizer 130 may be configured to substantially transmit the p-polarized image light 461p of green color as a p-polarized image light 463p of green color, and the p-polarized image light 452p of green color as a p-polarized image light 454p of green color. The p-polarized image light 463p of green color and the p-polarized image light 454p of green color may be perceived by a viewer of the display device 400.

Due to the polarization selectivity of the reflective polarizer 110 and the polarization reversion of the reflector 135, a polarization recirculation of the image light 441 emitted from the light-emitting element 107 may be achieved, which may significantly increase the light transmission efficiency of the display device 400. Accordingly, the power efficiency of the display device 400 may be significantly improved.

Referring to FIGS. 4A and 4B, the optical path of the image light 441 propagating through other subpixels (e.g., red subpixels 150a) of the display device 400 may be substantially the same as that shown in FIG. 4B. For example, the image light 441 propagating through the red subpixels 150a may be output as a p-polarized image light of red color from the linear polarizer 130. The image light 441 propagating through the blue-subpixels 150c of the display device 400 may not be subject to the polarization-selective reflection or transmission of the reflective polarizer 110, as the third polarizer units 110c corresponding to the third (e.g., blue) subpixels 150c may not include any sub-reflective polarizer. Instead, the image light 441 of the blue color may directly transmit through the third polarizer units 110c of the reflective polarizer 110. In addition, the image light 441 propagating through the blue-subpixels 150c of the display device 400 may not be subject to the color conversion process of the color conversion layer 120, as the third color conversion units 120c corresponding to the third (e.g., blue) subpixels 150c may not include a color conversion material. Instead, the image light 441 of the blue color may directly transmit through the third color conversion units 120c of the color conversion layer 120. The image light 441 propagating through the blue-subpixels 150c of the display device 400 may be output as a p-polarized image light of blue color from the linear polarizer 130. Thus, the display device 400 may display full color images with enhanced brightness.

As shown in FIG. 4C, the ambient light 471 may be a polychromatic visible light including a red portion, a green portion, and a blue portion. For discussion purposes, the ambient light 471 may be an unpolarized light. The linear polarizer 130 may be configured to convert the ambient light 471 into a p-polarized light 473p propagating toward the color filter layer 125. The second color filter (e.g., green color filter) 125b in the color filter layer 125 may be configured to substantially block the red and blue portions of the p-polarized light 473p, and substantially transmit the green portion of the p-polarized light 473p as a p-polarized light 475p of green color propagating toward the reflective polarizer 110. The second polarizer unit 110b in the reflective polarizer 110 with a designed operating wavelength band within, at least partially overlapping with, or corresponding to (e.g., substantially the same as) the blue wavelength band may transmit the p-polarized light 475p of green color as a p-polarized light 477p of green color propagating toward the color conversion layer 120. The second color conversion unit 120b in the color conversion layer 120 may be configured to substantially transmit the p-polarized light 477p of green color as a p-polarized light 479p of green color propagating toward the waveplate 115. The waveplate 115 may be configured to convert the p-polarized light 479p of green color into an RHCP light 481R of green color propagating toward the display panel 105 and the reflector 135.

The reflector 135 may be configured to reflect the RHCP light 481R of green color as an LHCP light 483L of green color back to the display panel 105, and to the waveplate 115. The waveplate 115 may be configured to convert the LHCP light 483L of green color into an s-polarized light 485s of green color propagating toward the color conversion layer 120. The second color conversion unit 120b in the color conversion layer 120 may be configured to substantially transmit the s-polarized light 485s of green color as an s-polarized light 487s of green color propagating toward the reflective polarizer 110. The second polarizer unit 110b in the reflective polarizer 110 with a designed operating wavelength band within, at least partially overlapping with, or corresponding to (e.g., substantially the same as) the blue wavelength band may transmit the s-polarized light 487s of green color as an s-polarized light 489s of green color propagating toward the color filter layer 125.

The second color filter (e.g., green color filter) 125b in the color filter layer 125 may be configured to substantially transmit the s-polarized light 489s of green color as an s-polarized light 491s of green color propagating toward the linear polarizer 130. The linear polarizer 130 may block, via absorption, the s-polarized light 491s of green color from being output out of the display device 400.

Due to the color selective absorption of the color filter layer 125 and the polarization reversion of the reflector 135, the red and blue portions of the ambient light 471 may be absorbed by the second color filters (e.g., green color filters) 125b in the color filter layer 125, and the green portion of the ambient light 471 reflected by the reflector 135 may be absorbed by the linear polarizer 130. Referring to FIG. 4A and FIG. 4C, the optical path of the ambient light 471 propagating through other subpixels (e.g., red subpixels 150a, blue-subpixels 150c) of the display device 400 may be substantially the same as that shown in FIG. 4C. For example, the ambient light 471 propagating through the red subpixels 150a and the blue-subpixels 150c may be converted into an s-polarized light of red color and an s-polarized light of blue color, which may be blocked by the linear polarizer 130 from being output out of the display device 400. Thus, the reflection of the ambient light 471 from the reflector 135 may be reduced. The ambient light 471 reflected by the display device 400 may not be perceived by the viewer of the display device 400. The contrast ratio of the display device 400 may be significantly increased, and the image performance of the display device 400 may be significantly enhanced.

Figure 5A:
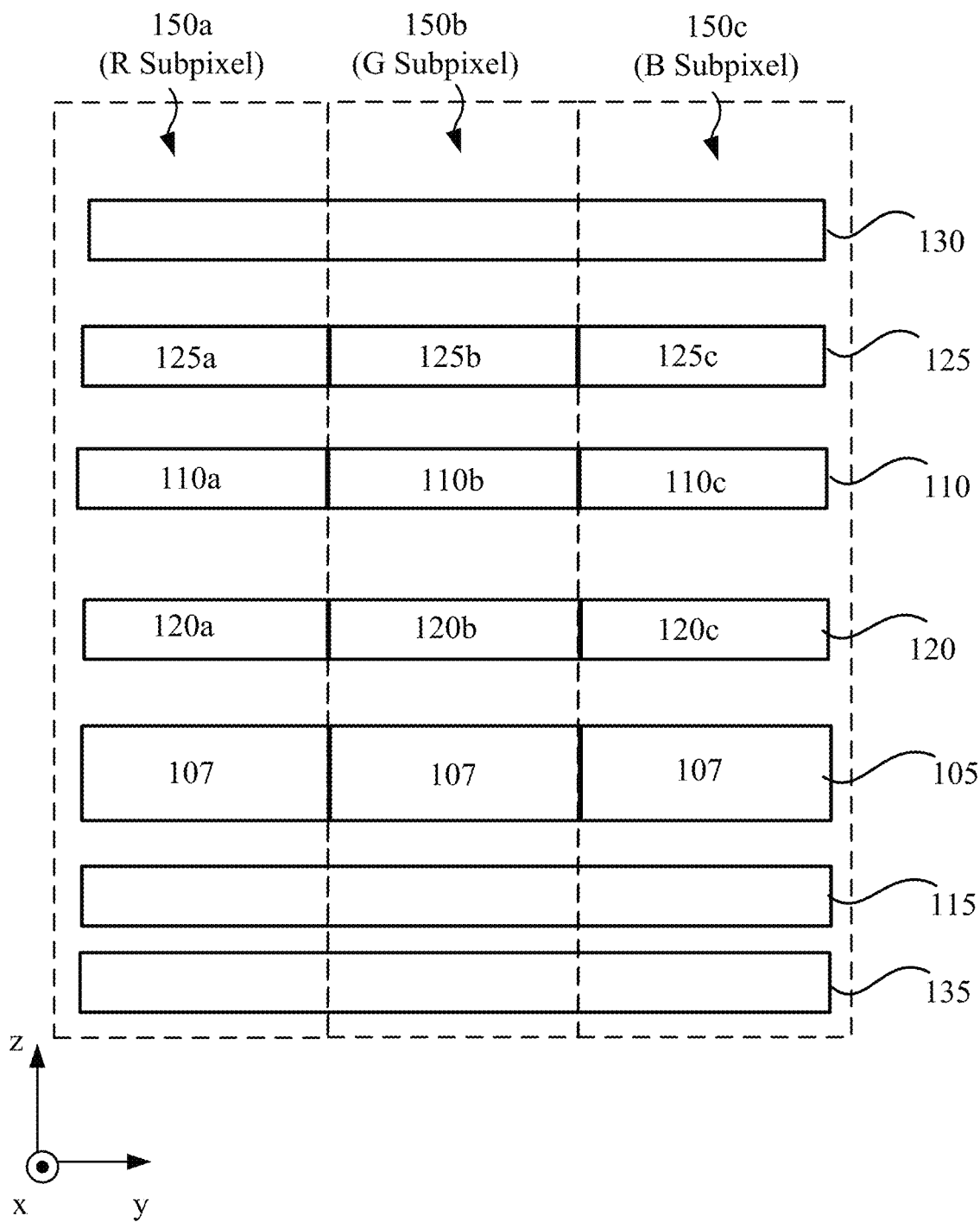
FIG. 5A schematically illustrates a display device, according to an embodiment of the present disclosure.

FIG. 5A schematically illustrates a y-z sectional view of a display device 500, according to an embodiment of the present disclosure. The display device 500 may be an emissive display device, e.g., an OLED display device, an LED display device, a micro-OLED display device, or a micro-LED display device, etc. The display device 500 may include elements that are the same as or similar to those included in the display device 100 shown in FIGS. 1A-1C, the display device 200 shown in FIGS. 2A-2C, the display device 300 shown in FIGS. 3A-3C, or the display device 400 shown in FIGS. 4A-4C. Descriptions of the same or similar elements may refer to the above descriptions rendered in connection with FIGS. 1A-1C, FIGS. 2A-2C, FIGS. 3A-3C, or FIGS. 4A-4C.

For example, as shown in FIG. 5A, the display device 500 may include the display panel 105 including the light-emitting elements 107, the color conversion layer 120, the reflective polarizer 110, and the color filter layer 125. In some embodiments, the color conversion layer 120, the reflective polarizer 110, and the color filter layer 125 may be disposed at the light outputting side (e.g., the first side or surface) of the display panel 105 facing a viewer of the display device 500. In the embodiment shown in FIG. 5A, the reflective polarizer 110 may be disposed between the color conversion layer 120 and the color filter layer 125, and the color conversion layer 120 may be disposed between the reflective polarizer 110 and the display panel 105.

In some embodiments, the display device 500 may also include the reflector 135 disposed at the bottom of the display panel 105, e.g., disposed at the back side (e.g., the second side or surface) of the display panel 105 opposite to the light outputting side (e.g., the first side or surface) that is at the viewer's side of the display device 500. In some embodiments, the display device 500 may also include the waveplate 115 disposed at the second side of the display panel 105, between the reflector 135 and the display panel 105. In some embodiments, the display device 500 may also include the linear polarizer 130 disposed at a light outputting side (e.g., the viewer's side) of the color filter layer 125, and the color filter layer 125 may be disposed between the linear polarizer 130 and the reflective polarizer 110. In the embodiment shown in FIG. 5A, the light-emitting element 107 may emit an image light of blue color, and the reflective polarizer 110 may be a linear reflective polarizer with a designed operating wavelength band within, at least partially overlapping with, or corresponding to (e.g., substantially the same as) the emission wavelength band of the light-emitting elements 107, e.g., the blue wavelength band.

Figure 5B:
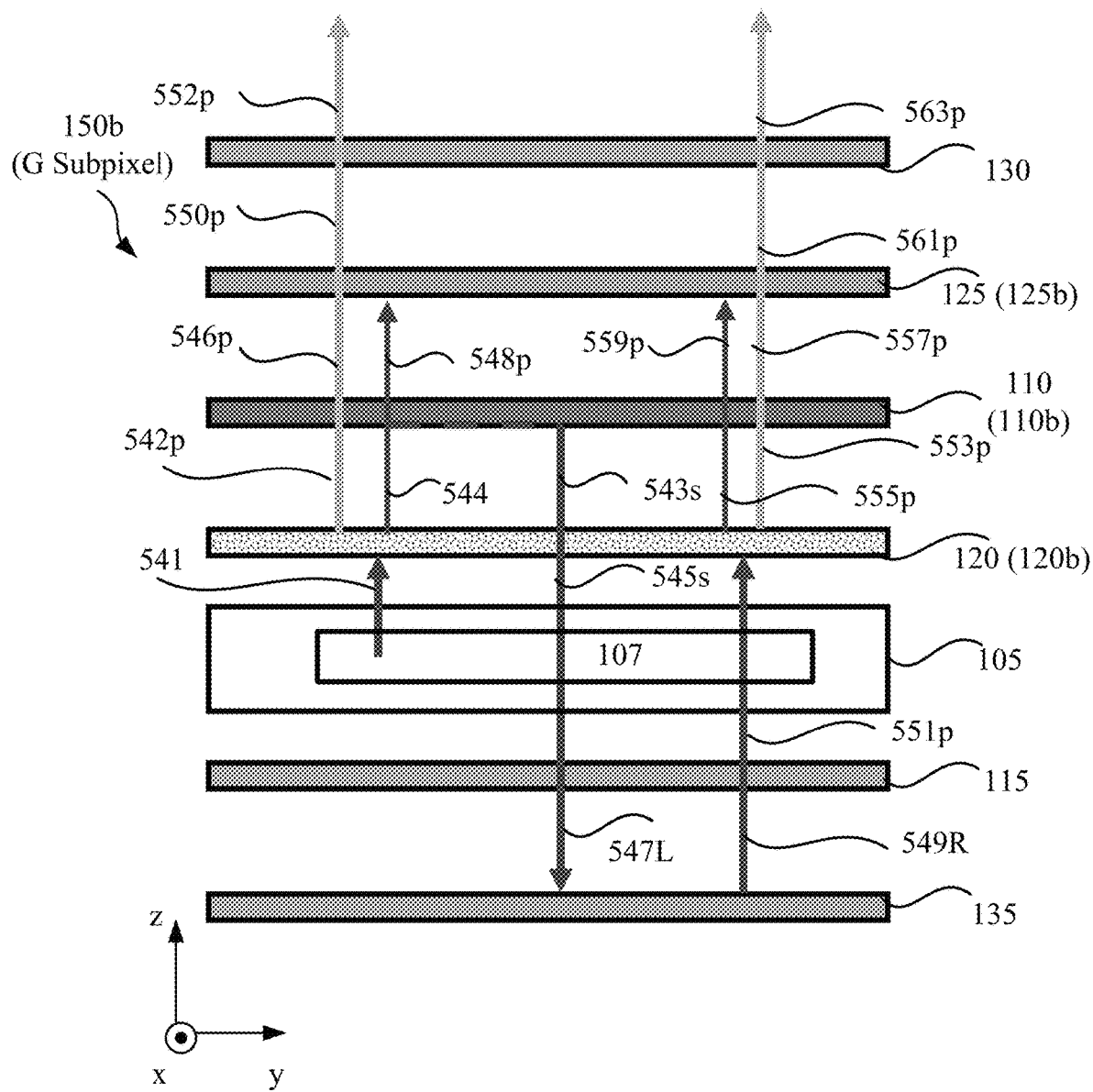
FIG. 5B schematically illustrates an optical path of an image light propagating in the display device shown in FIG. 5A, according to an embodiment of the present disclosure.
Figure 5C:
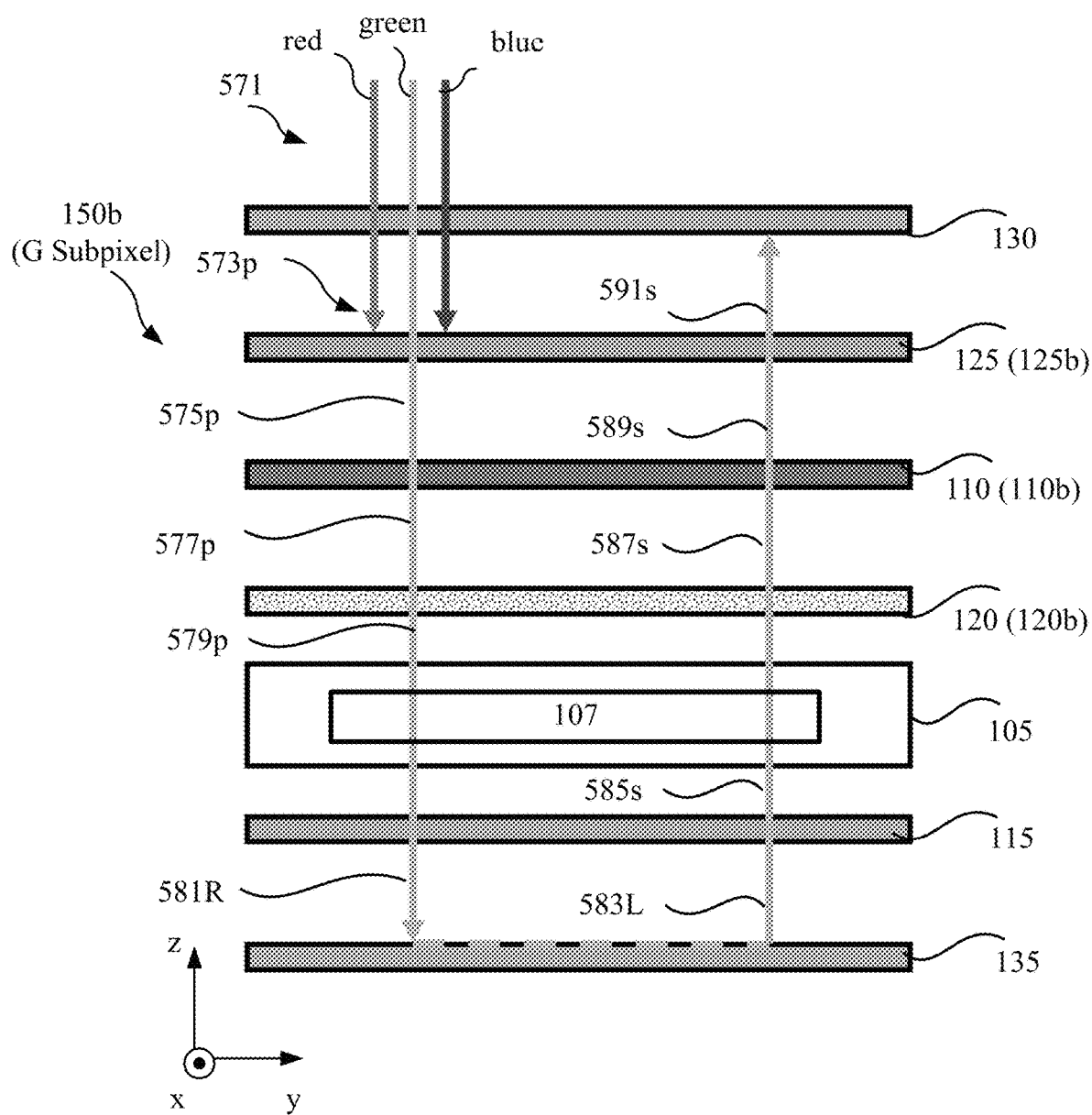
FIG. 5C schematically illustrates an optical path of an ambient light propagating in the display device shown in FIG. 5A, according to an embodiment of the present disclosure.

FIG. 5B schematically illustrates an optical path of an image light 541 propagating in the display device 500 shown in FIG. 5A, according to an embodiment of the present disclosure. FIG. 5C schematically illustrates an optical path of an ambient light 571 propagating in the display device 500 shown in FIG. 5A, according to an embodiment of the present disclosure. For discussion purposes, FIG. 5B or FIG. 5C shows a portion of the optical path of the image light 541 or the ambient light 571 propagating through a single second subpixel (e.g., green subpixel) 150b. Optical paths of the image light 541 or the ambient light 571 propagating through other subpixels (e.g., red subpixels 150a) of the display device 500 may be substantially the same as that shown in FIG. 5B or FIG. 5C. In FIG. 5B and FIG. 5C, "R" denotes a right-handed circularly polarized ("RHCP") light, "L" denotes a left-handed circularly polarized ("LHCP") light, "s" denotes an s-polarized light, and "p" denotes a p-polarized light.

For discussion purpose, in FIG. 5B, the light-emitting element 107 may emit an image light 541 that is an unpolarized blue image light. That is, the image light 541 may be associated with a first predetermined wavelength band, e.g., the blue wavelength band. The unpolarized image light 541 of blue color may propagate in the forward direction toward the color conversion layer 120. The second color conversion unit 120b in the color conversion layer 120 may be configured to convert the unpolarized image light 541 of blue color into an p-polarized image light 542p of green color. For example, the second color conversion units 120b may include the second color conversion material configured to absorb the unpolarized image light 541 of blue color and emit the p-polarized image light 542p of green color. In some embodiments, the unpolarized image light 541 of blue color may not be fully converted into the p-polarized image light 542p of green color by the second color conversion unit 120b. In some embodiments, a portion of the unpolarized image light 541 of blue color may transmit through the second color conversion unit 120b as an unpolarized image light 544 of blue color. The p-polarized image light 542p of green color and the unpolarized image light 544 of blue color may propagate toward the reflective polarizer 110.

In the embodiment shown in FIG. 5B, the reflective polarizer 110 may be a linear reflective polarizer with a designed operating wavelength band within, at least partially overlapping with, or corresponding to (e.g., substantially the same as) the blue wavelength band. For discussion purpose, the reflective polarizer 110 may be configured to substantially reflect an s-polarized light of the blue wavelength band, and substantially transmit a p-polarized light of the blue wavelength band. For discussion purpose, the reflective polarizer 110 may substantially maintain a polarization of a polarized light while reflecting or transmitting the polarized light. As shown in FIG. 5B, the second polarizer units 110b in the reflective polarizer 110 may be configured to substantially transmit the p-polarized image light 542p of green color as an p-polarized image light 546p of green color. In addition, the second polarizer units 110b in the reflective polarizer 110 may be configured to substantially transmit a p-polarized component of the unpolarized image light 544 of blue color as a p-polarized image light 548*p* of blue color propagating toward the color filter layer 125, and substantially reflect an s-polarized component of the unpolarized image light 544 of blue color as an s-polarized image light 543*s* of blue color back to the color conversion layer 120.

The second color conversion unit 120*b* in the color conversion layer 120 may be configured to convert the s-polarized image light 543*s* of blue color to an image light of green color (not shown). In some embodiments, the s-polarized image light 543*s* of blue color may not be fully converted into the image light of green color (not shown) by the second color conversion unit 120*b*. In some embodiments, a portion of the s-polarized image light 543*s* of blue color may transmit through the second color conversion unit 120*b* as an s-polarized image light 545*s* of blue color. The s-polarized image light 545*s* of blue color may propagate toward the display 105 and the waveplate 115.

The waveplate 115 may be configured to convert the s-polarized image light 545*s* of blue color into an LHCP image light 547L of blue color propagating toward the reflector 135. The reflector 135 may be configured to reflect the LHCP image light 547L of blue color as an RHCP image light 549R of blue color back to the waveplate 115. The waveplate 115 may be configured to convert the RHCP image light 549R of blue color into a p-polarized image light 551*p* of blue color propagating toward the display panel 105 and the color conversion layer 120.

The second color conversion unit 120*b* in the color conversion layer 120 may be configured to convert the p-polarized image light 551*p* of blue color into a p-polarized image light 553*p* of green color. That is, the p-polarized image light 553*p* may be associated with a second predetermined wavelength band, e.g., the green wavelength band. In some embodiments, the p-polarized image light 551*p* of blue color may not be fully converted into the p-polarized image light 553*p* of green color by the second color conversion unit 120*b*. In some embodiments, a portion of the p-polarized image light 551*p* of blue color may transmit through the second color conversion unit 120*b* as a p-polarized image light 555*p* of blue color.

The p-polarized image light 553*p* of green color and the p-polarized image light 555*p* of blue color may propagate toward the reflective polarizer 110. The second polarizer units 110*b* in the reflective polarizer 110 may be configured to substantially transmit the p-polarized image light 553*p* of green color and the p-polarized image light 555*p* of blue color as a p-polarized image light 557*p* of green color and a p-polarized image light 559*p* of blue color, respectively. The p-polarized image light 557*p* of green color and the p-polarized image light 559*p* of blue color may propagate toward the color filter layer 125.

The second color filter (e.g., green color filter) 125*b* in the color filter layer 125 may be configured to substantially transmit the p-polarized image light 557*p* of green color as p-polarized image light 561*p* of green color, and substantially transmit the p-polarized image light 546*p* of green color as an p-polarized image light 550*p* of green color. The second color filter (e.g., green color filter) 125*b* in the color filter layer 125 may be configured to substantially block the p-polarized image light 559*p* of blue color and the p-polarized image light 548*p* of blue color.

The linear polarizer 130 may be configured to substantially transmit a p-polarized light and substantially block an s-polarized light. Thus, the linear polarizer 130 may substantially transmit the p-polarized image light 561*p* of green color as a p-polarized image light 563*p* of green color, and substantially transmit the p-polarized image light 550*p* of green color as a p-polarized image light 552*p* of green color. The p-polarized image light 563*p* of green color and the p-polarized image light 552*p* of green color may be perceived by a viewer of the display device 500.

Due to the polarization selectivity of the reflective polarizer 110 and the polarization reversion of the reflector 135, a polarization recirculation of the image light 541 emitted from the light-emitting element 107 may be achieved, which may significantly increase the light transmission efficiency of the display device 200. Accordingly, the power efficiency of the display device 500 may be significantly enhanced.

Referring to FIGS. 5A and 5B, the optical path of the image light 541 propagating through other subpixels (e.g., red subpixels 150*a*) of the display device 500 may be substantially the same as that shown in FIG. 5B. For example, the image light 541 propagating through the red subpixels 150*a* may be output as a p-polarized image light of red color from the linear polarizer 130. The image light 541 propagating through the blue-subpixels 150*c* of the display device 500 may not be subject to the polarization-selective reflection or transmission of the reflective polarizer 110, as the third polarizer units 110*c* corresponding to the third (e.g., blue) subpixels 150*c* may not include any sub-reflective polarizer. Instead, the image light 541 of the blue color may directly transmit through the third polarizer units 110*c* of the reflective polarizer 110. In addition, the image light 541 propagating through the blue-subpixels 150*c* of the display device 500 may not be subject to the color conversion process of the color conversion layer 120, as the third color conversion units 120*c* corresponding to the third (e.g., blue) subpixels 150*c* may not include a color conversion material. Instead, the image light 541 of the blue color may directly transmit through the third color conversion units 120*c* of the color conversion layer 120. The image light 541 propagating through the blue-subpixels 150*c* of the display device 500 may be output as a p-polarized image light of blue color from the linear polarizer 130. Thus, the display device 500 may display full color images with enhanced brightness.

As shown in FIG. 5C, the ambient light 571 may be a polychromatic visible light including a red portion, a green portion, and a blue portion. For discussion purposes, the ambient light 571 may be an unpolarized light. The linear polarizer 130 may be configured to convert the ambient light 571 into a p-polarized light 573*p* propagating toward the color filter layer 125. The second color filter (e.g., green color filter) 125*b* in the color filter layer 125 may be configured to substantially block the red and blue portions of the p-polarized light 573*p*, and substantially transmit the green portion of the p-polarized light 573*p* as a p-polarized light 575*p* of green color propagating toward the reflective polarizer 110. The second polarizer unit 110*b* in the reflective polarizer 110 with a designed operating wavelength band within, at least partially overlapping with, or corresponding to (e.g., substantially the same as) the blue wavelength band may transmit the p-polarized light 575*p* of green color as a p-polarized light 577*p* of green color propagating toward the color conversion layer 120. The second color conversion unit 120*b* in the color conversion layer 120 may be configured to substantially transmit the p-polarized light 577*p* of green color as a p-polarized light 579*p* of green color propagating toward the display panel 105 and the waveplate 115. The waveplate 115 may be configured to convert the p-polarized light 579*p* of green color into an RHCP light 581R of green color propagating toward the reflector 135.

The reflector 135 may be configured to reflect the RHCP light 581R of green color as an LHCP light 583L of green color back to the waveplate 115. The waveplate 115 may be configured to convert the LHCP light 583L of green color into an s-polarized light 585s of green color propagating toward the display panel 105 and the color conversion layer 120. The second color conversion unit 120b in the color conversion layer 120 may be configured to substantially transmit the s-polarized light 585s of green color as an s-polarized light 587s of green color propagating toward the reflective polarizer 110. The second polarizer unit 110b in the reflective polarizer 110 with a designed operating wavelength band within, at least partially overlapping with, or corresponding to (e.g., substantially the same as) the blue wavelength band may transmit the s-polarized light 587s of green color as an s-polarized light 589s of green color propagating toward the color filter layer 125.

The second color filter (e.g., green color filter) 125b in the color filter layer 125 may be configured to substantially transmit the s-polarized light 589s of green color as an s-polarized light 591s of green color propagating toward the linear polarizer 130. The linear polarizer 130 may block, via absorption, the s-polarized light 591s of green color. Thus, the s-polarized light 591s of green color may not be output from the display device 500.

Due to the color selective absorption of the color filter layer 125 and the polarization reversion of the reflector 135, the red and blue portions of the ambient light 571 may be absorbed by the second color filters (e.g., green color filters) 125b in the color filter layer 125, and the green portion of the ambient light 571 reflected by the reflector 135 may be absorbed by the linear polarizer 130. Referring to FIG. 5A and FIG. 5C, the optical path of the ambient light 571 propagating through other subpixels (e.g., red subpixels 150a, blue-subpixels 150c) of the display device 500 may be substantially the same as that shown in FIG. 5C. For example, the ambient light 571 propagating through the red subpixels 150a and the blue-subpixels 150c may be converted into an s-polarized light of red color and an s-polarized light of blue color, which may be blocked by the linear polarizer 130 from being output out of the display device 500. Thus, the reflection of the ambient light 571 by the reflector 135 may be reduced. The ambient light 571 reflected by the display device 500 may not be perceived by the viewer of the display device 500. The contrast ratio of the display device 500 may be significantly increased, and the image performance of the display device 500 may be significantly enhanced.

For illustrative purposes, FIGS. 1B and 1C, FIGS. 2B and 2C, FIGS. 3B and 3C, FIGS. 4B and 4C, and FIGS. 5B and 5C show that the light-emitting elements 107 emit a blue image light. In such an embodiment, the reflective polarizer 110 may be a patterned reflective polarizer with a designed operating wavelength band within, at least partially overlapping with, or corresponding to (e.g., substantially the same as) the blue wavelength band. In some embodiments, both of the first polarizer units 110a corresponding to the first (e.g., red) subpixels 150a and the second polarizer units 110b corresponding to the second (e.g., green) subpixels 150b may include the sub-reflective polarizers. The third polarizer units 110c corresponding to the third (e.g., blue) subpixels 150c may not include any sub-reflective polarizer. In the color conversion layer 120, the first color conversion units 120a corresponding to the first (e.g., red) subpixels 150a may include the first color conversion material configured to absorb the blue image light and emit a first (e.g., red) image light. The second color conversion units 120b corresponding to the second (e.g., green) subpixels 150b may include the second color conversion material configured to absorb the blue image light and emit a second (e.g., green) image light. The third color conversion units 120c corresponding to the third (e.g., blue) subpixels 150c may not include a color conversion material, and may directly transmit the blue image light emitted by the light-emitting elements 107.

In some embodiments, the light-emitting elements 107 in the display panel 105 shown in FIGS. 1A-1C, FIGS. 2A-2C, FIGS. 3A-3C, FIGS. 4A-4C, or FIGS. 5A-5C may emit a UV image light. In such an embodiment, the reflective polarizer 110 may not be a patterned reflective polarizer. Instead, the reflective polarizer 110 may be a uniform reflective polarizer with a designed operating wavelength band within, at least partially overlapping with, or corresponding to (e.g., substantially the same as) the UV wavelength band. The first polarizer units 110a corresponding to the first (e.g., red) subpixels 150a, the second polarizer units 110b corresponding to the second (e.g., green) subpixels 150b, and the third polarizer units 110c corresponding to the third (e.g., blue) subpixels 150c may include the sub-reflective polarizers. In the color conversion layer 120, the first color conversion units 120a corresponding to the first (e.g., red) subpixels 150a may include the first color conversion material configured to absorb the UV image light and emit a first (e.g., red) image light. The second color conversion units 120b corresponding to the second (e.g., green) subpixels 150b may include the second color conversion material configured to absorb the UV image light and emit a second (e.g., green) image light. The third color conversion units 120c corresponding to the third (e.g., blue) subpixels 150c may include the third color conversion material configured to absorb the UV image light and emit a third (e.g., blue) image light.

The optical paths of the UV image light propagating through other subpixels (e.g., red subpixels 150a, blue subpixels 150c) of the display device 100, 200, 300, 400, or 500 may be substantially the same as that shown in FIG. 1B, FIG. 2B, FIG. 3B, FIG. 4B, or FIG. 5B. For example, the UV image light propagating through the red subpixels 150a may be output as a p-polarized image light of red color from the linear polarizer 130. The UV image light propagating through the blue subpixels 150c may be output as a p-polarized image light of blue color from the linear polarizer 130. Thus, the display device 100, 200, 300, 400, or 500 may display full color images with enhanced brightness.

The optical paths of the ambient light propagating through other subpixels (e.g., red subpixels 150a, blue-subpixels 150c) of the display device 100, 200, 300, 400, or 500 may be substantially the same as that shown in FIG. 1C, FIG. 2C, FIG. 3C, FIG. 4C, or FIG. 5C. For example, the ambient light propagating through the red subpixels 150a and the blue-subpixels 150c may be converted into an s-polarized light of red color and an s-polarized light of blue color, which may be blocked by the linear polarizer 130 from being output out of the display device 100, 200, 300, 400, or 500. Thus, the reflection of the ambient light from the bottom reflector 135 may be reduced. The ambient light falling on the display device 100, 200, 300, 400, or 500 may not be perceived by the viewer. The contrast ratio of the display device 500 may be significantly increased, and the image performance of the display device 100, 200, 300, 400, or 500 may be significantly enhanced.

For illustrative purposes, FIGS. 1B and 1C, FIGS. 2B and 2C, FIGS. 3B and 3C, FIGS. 4B and 4C, and FIGS. 5B and 5C show the optical path of the image light emitted from the light-emitting elements 411 in the upward or forward direction (e.g., +z-axis direction). In some embodiments, the image light emitted from the light-emitting elements 107 may propagate in the backward direction (e.g., -z-axis direction). The image light propagating in the backward direction may be reflected by the bottom reflector 135 to propagate in the upward or forward direction, back to the display panel 105. The reflected image light (not shown) from the bottom reflector 135 may have an optical path that is similar to that of the image light 141, 241, 341, 441, or 541 when the reflected image light propagates through the elements included in the display device.

For discussion purposes, the display device 100, 200, 300, 400, or 500 in FIGS. 1A-1D, FIGS. 2A-2C, FIGS. 3A-3C, FIGS. 4A-4C, or FIGS. 5A-5C are shown as a polychromatic display device with high brightness and contrast ratio, e.g., a red-green-blue ("RGB") display device including red subpixels 150a, green subpixels 150b, and blue subpixels 150c arranged in an array. A monochromatic display device with high brightness and contrast ratio may also be configured following the same design principles for the polychromatic display device described above. For example, a green, red, or blue monochromatic display device with high brightness and contrast ratio may be configured to include a plurality of green, red, or blue subpixels arranged in an array. In some embodiments, when the light-emitting elements emit a UV image light, each green, red, or blue subpixel may be configured to have a structure similar to that shown in FIGS. 1B-1D, FIGS. 2B and 2C, FIGS. 3B and 3C, FIGS. 4B and 4C, or FIGS. 5B and 5C.

In some embodiments, when the light-emitting elements emit a blue image light, each green or red subpixel may be configured to have a structure similar to that shown in FIGS. 1B-1D, FIGS. 2B and 2C, FIGS. 3B and 3C, FIGS. 4B and 4C, or FIGS. 5B and 5C. In some embodiments, when the light-emitting elements emit a blue image light, the blue subpixels may not include a reflective polarizer and a color conversion layer. In a disclosed monochromatic display device, the reflective polarizer may be a uniform reflective polarizer rather than a patterned reflective polarizer. The color conversion layer may be a uniform color conversion layer including a color conversion material, rather than including a plurality of color conversion units with different color conversion materials. In some embodiments, a polychromatic display device with high brightness and contrast ratio may also be configured by stacking a plurality of monochromatic display devices with high brightness and contrast ratio. For example, an RGB display device with high brightness and contrast ratio may include a stack of red, green, and blue monochromatic display devices with high brightness and contrast ratio. In some embodiments, a polychromatic display device with high brightness and contrast ratio may also be configured by grouping a plurality of monochromatic display devices with high brightness and contrast ratio. For example, an RGB display device with high brightness and contrast ratio may include a group of red, green, and blue monochromatic display devices with high brightness and contrast ratio.

In the display device 100, 200, 300, 400, or 500 shown in FIGS. 1A-1D, FIGS. 2A-2C, FIGS. 3A-3C, FIGS. 4A-4C, or FIGS. 5A-5C, the display panel 105 includes light-emitting elements 107, such as OLEDs, LEDs, micro-OLEDs, or micro-LEDs, which are for illustrative purposes. In some embodiments, the display panel 105 may include other suitable light-emitting elements other than light-emitting diodes, such as laser diodes (or diode lasers) or super-luminescent diodes.

The display devices disclosed herein with enhanced polarization emission and reduced surface reflection may have numerous applications in a large variety of fields, e.g., near-eye displays ("NEDs"), head-up displays ("HUDs"), head-mounted displays "HMDs"), smart phones, laptops, televisions, vehicles, etc., which are all within the scope of the present disclosure. For example, the display devices disclosed herein may be implemented into an optical system to boost the display brightness, improve the battery time, and reduce the ghost images and increase the contrast ratio in a bright environment. Some exemplary applications in augmented reality ("AR"), virtual reality ("VR"), mixed reality ("MR") fields or some combinations thereof will be explained below. Near-eye displays ("NEDs") have been widely used in a large variety of applications, such as aviation, engineering, science, medicine, computer gaming, video, sports, training, and simulations. One application of NEDs is to realize VR, AR, MR or some combination thereof.

Desirable characteristics of NEDs include compactness, light weight, high resolution, large field of view ("FOV"), and small form factor. An NED may include a display element configured to generate an image light and a lens system configured to direct the image light toward eyes of a user. The lens system may include a plurality of optical elements, such as lenses, waveplates, reflectors, etc., for focusing the image light to the eyes of the user. To achieve a compact size and light weight and to maintain satisfactory optical characteristics, an NED may adopt a pancake lens assembly in the lens system to fold the optical path, thereby reducing a back focal distance in the NED.

FIG. 6A illustrates a schematic diagram of an optical system 600 according to an embodiment of the present disclosure. The optical system 600 may include a display device 650, and a pancake lens assembly 601 coupled to the display device 650. The display device 650 may be configured to display a virtual image with high brightness and contrast ratio. In some embodiments, the display device 650 may be a monochromatic display device, e.g., a red, green, or blue display device. In some embodiments, the display device 650 may be a polychromatic display device, e.g., a red-green-blue ("RGB") display device. In some embodiments, the display device 650 may be a polychromatic display device including a stack of a plurality of monochromatic displays, e.g., an RGB display device including a stack of red, green, and blue display devices. The display device 650 may be an embodiment of the display devices disclosed herein, such as the display device 100 shown in FIGS. 1A-1D, the display device 200 shown in FIGS. 2A-2C, the display device 300 shown in FIGS. 3A-3C, the display device 400 shown in FIGS. 4A-4C, or the display device 500 shown in FIGS. 5A-5C.

As shown in FIG. 6A, the display device 650 may be configured to output a polarized image light 621 (that forms the virtual image) toward the pancake lens assembly 601. The pancake lens assembly 601 may be configured to focus the polarized image light 621 to an eye-box located at an exit pupil 660. The exit pupil 660 may be at a location where an eye 665 is positioned in an eye-box region when a user wears the NED. In some embodiments, the pancake lens assembly 601 may include a first optical element 605 and a second optical element 610. In some embodiments, the pancake lens assembly 601 may be configured as a monolithic pancake lens assembly without any air gaps between optical elements included in the pancake lens assembly. In some embodiments, one or more surfaces of the first optical element 605 and the second optical element 610 may be shaped (e.g., curved) to compensate for field curvature. In some embodiments, one or more surfaces of the first optical element 605 and/or the second optical element 610 may be shaped to be spherically concave (e.g., a portion of a sphere), spherically convex, a rotationally symmetric asphere, a freeform shape, or some other shape that can mitigate field curvature. In some embodiments, the shape of one or more surfaces of the first optical element 605 and/or the second optical element 610 may be designed to additionally compensate for other forms of optical aberration.

In some embodiments, one or more of the optical elements within the pancake lens assembly 601 may have one or more coatings, such as an anti-reflective coating, to reduce ghost images and enhance contrast. In some embodiments, the first optical element 605 and the second optical element 610 may be coupled together by an adhesive 615. Each of the first optical element 605 and the second optical element 610 may include one or more optical lenses. In some embodiments, at least one of the first optical element 605 or the second optical element 610 may have at least one flat surface.

The first optical element 605 may include a first surface 605-1 facing the display device 650 and an opposing second surface 605-2 facing the eye 665. The first optical element 605 may be configured to receive an image light at the first surface 605-1 from the display device 650 and output an image light with an altered property at the second surface 605-2. The pancake lens assembly 601 may also include a mirror 606 that may be an individual layer, film, or coating disposed at (e.g., bonded to or formed at) the first optical element 605. The mirror 606 may be disposed at (e.g., bonded to or formed at) the first surface 605-1 or the second surface 605-2 of the first optical element 605.

For discussion purposes, FIG. 6A shows that the mirror 606 is disposed at (e.g., bonded to or formed at) the first surface 605-1. In some embodiments, the mirror 606 may be disposed at the second surface 605-2 of the first optical element 605. In some embodiments, the mirror 606 may be a partial reflector that is partially reflective to reflect a portion of a received light. In some embodiments, the mirror 606 may be configured to transmit about 50% and reflect about 50% of a received light, and may be referred to as a "50/50 mirror."

The second optical element 610 may have a first surface 610-1 facing the first optical element 605 and an opposing second surface 610-2 facing the eye 665. The pancake lens assembly 601 may also include a linear reflective polarizer 608, which may be an individual layer, film, or coating disposed at (e.g., bonded to or formed at) the second optical element 610. The linear reflective polarizer 608 may be disposed at (e.g., bonded to or formed at) the first surface 610-1 or the second surface 610-2 of the second optical element 610 and may receive a light output from the mirror 606. For discussion purposes, FIG. 6A shows that the linear reflective polarizer 608 is disposed at (e.g., bonded to or formed at) the first surface 610-1 of the second optical element 610. That is, the linear reflective polarizer 608 may be disposed between the first optical element 605 and the second optical element 610. In some embodiments, the linear reflective polarizer 608 may be disposed at the second surface 610-2 of the second optical element 610.

The pancake lens assembly 601 shown in FIG. 6A is merely for illustrative purposes. In some embodiments, one or more of the first surface 605-1 and the second surface 605-2 of the first optical element 605 and the first surface 610-1 and the second surface 610-2 of the second optical element 610 may be curved surface(s) or flat surface(s). In some embodiments, the pancake lens assembly 601 may have one optical element or more than two optical elements.

Figure 6B:
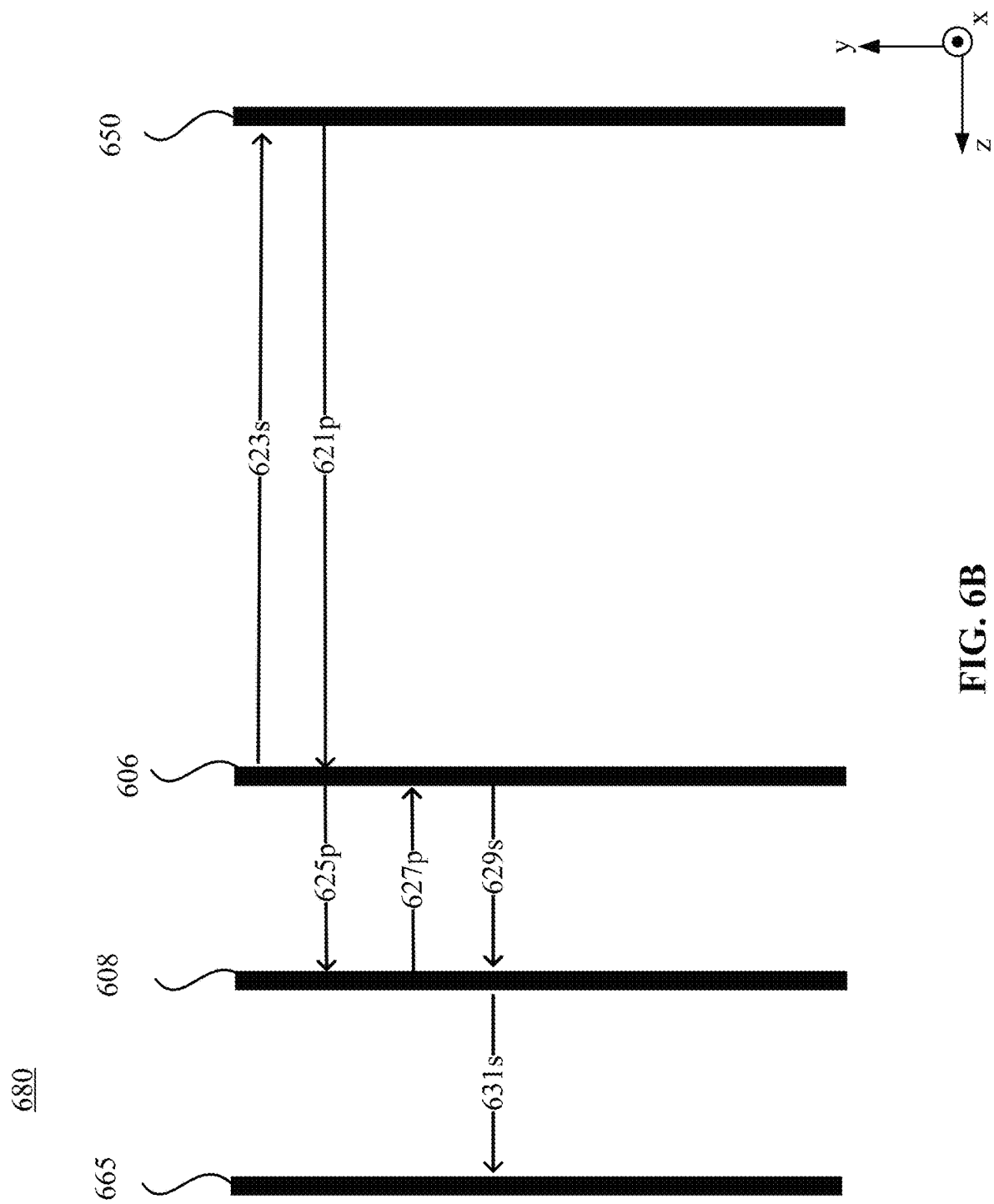
FIG. 6B schematically illustrates a cross-sectional view of an optical path of an image light propagating through the optical system shown in FIG. 6A, according to an embodiment of the present disclosure.

FIG. 6B illustrates a schematic cross-sectional view of an optical path 680 of an image light propagating in the pancake lens assembly 601 shown in FIG. 6A, according to an embodiment of the present disclosure. In the light propagation path 680, the change of polarization of the image light is shown. The first optical element 605 and the second optical element 610, which are presumed to be lenses that do not affect the polarization of the light, are omitted for the simplicity of illustration. In FIG. 6B, "s" denotes an s-polarized light, and "p" denotes a p-polarized light. For illustrative purposes, the display device 650, the mirror 606, and the linear reflective polarizer 608 are illustrated as flat surfaces in FIG. 6B. In some embodiments, one or more of the display device 650, the mirror 606, and the linear reflective polarizer 608 may include a curved surface.

For discussion purposes, the display device 650 may output a p-polarized image light 621p covering a predetermined spectrum, such as a portion of the visible spectral range or substantially the entire visible spectral range. The mirror 606 may reflect a first portion of the p-polarized image light 621p as an s-polarized image light 623s toward the display device 650, and transmit a second portion of the p-polarized image light 621p as a p-polarized image light 625p toward the linear reflective polarizer 608. The s-polarized image light 623s may be absorbed by a linear polarizer (e.g., similar to the linear polarizer 130 shown in FIGS. 1A-5C) of the display device 650. For discussion purpose, the linear reflective polarizer 608 may be configured to substantially reflect a p-polarized light, and substantially transmit an s-polarized light. Thus, the linear reflective polarizer 608 may reflect the p-polarized image light 625p as a p-polarized image light 627p back toward the mirror 606. The mirror 606 may reflect the p-polarized image light 627p as an s-polarized image light 629s toward the linear reflective polarizer 608, which may be transmitted through the linear reflective polarizer 608 as an s-polarized image light 631s. The s-polarized image light 631s may be focused onto the eye 665.

Figure 7A:
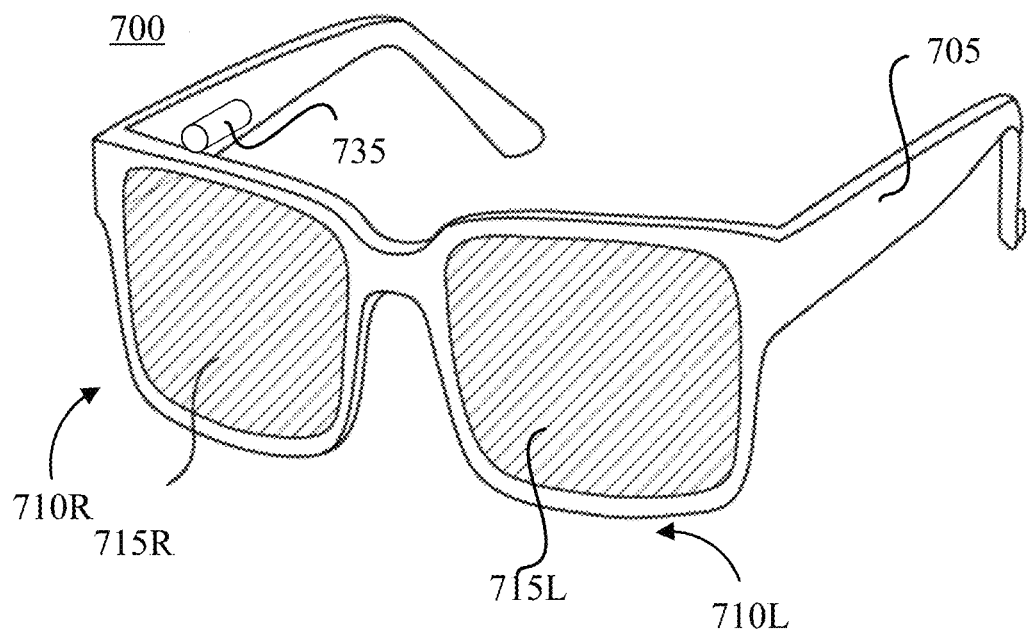
FIG. 7A illustrates a schematic diagram of a near-eye display ("NED"), according to an embodiment of the present disclosure.
Figure 7B:
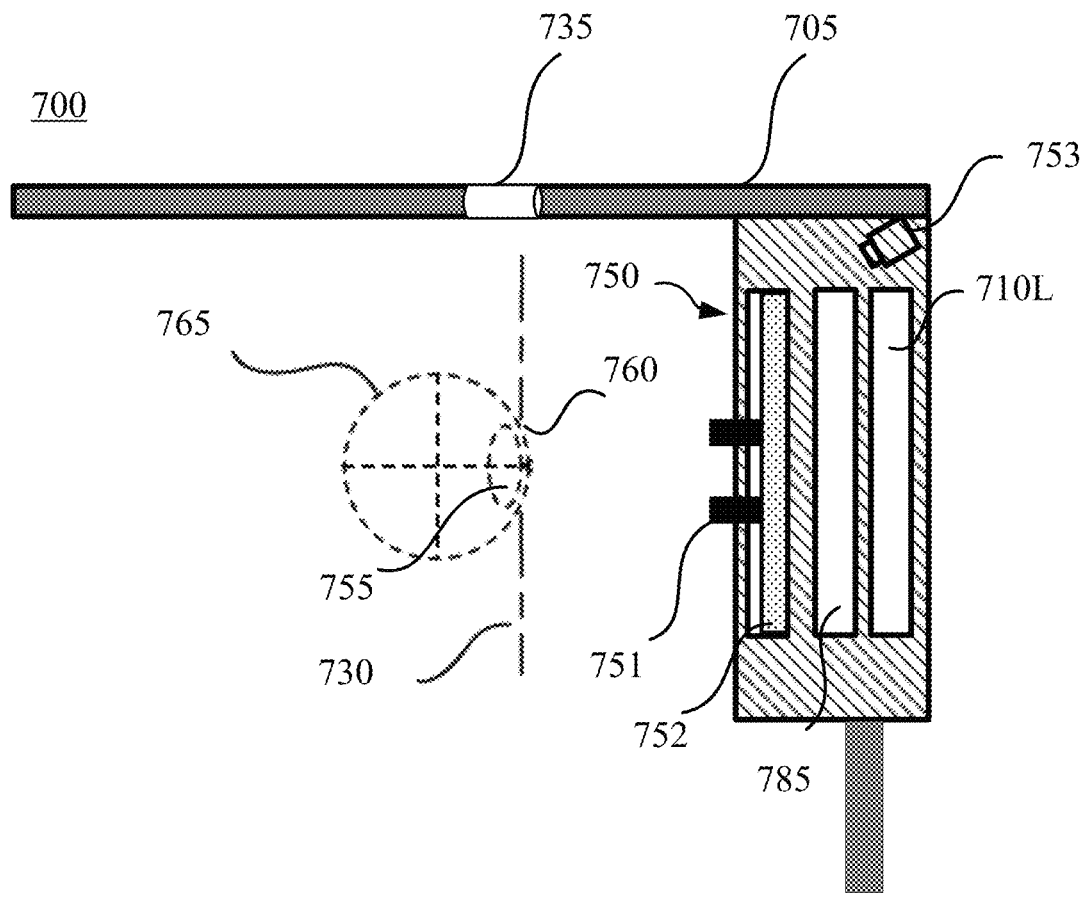
FIG. 7B illustrates a schematic cross sectional view of half of the NED shown in FIG. 7A, according to an embodiment of the present disclosure.

FIG. 7A illustrates a schematic diagram of a near-eye display ("NED") 700 according to an embodiment of the disclosure. FIG. 7B is a cross-sectional view of half of the NED 700 shown in FIG. 7A according to an embodiment of the disclosure. For purposes of illustration, FIG. 7B shows the cross-sectional view associated with a left-eye display system 710L. The NED 700 may include a controller (not shown). The NED 700 may include a frame 705 configured to mount to a user's head. The frame 705 is merely an example structure to which various components of the NED 700 may be mounted. Other suitable fixtures may be used in place of or in combination with the frame 705. The NED 700 may include right-eye and left-eye display systems 710R and 710L mounted to the frame 705. The NED 700 may function as a VR device, an AR device, an MR device, or any combination thereof. In some embodiments, when the NED 700 functions as an AR or an MR device, the right-eye and left-eye display systems 710R and 710L may be entirely or partially transparent from the perspective of the user, which may provide the user with a view of a surrounding real-world environment. In some embodiments, when the NED 700 functions as a VR device, the right-eye and left-eye display systems 710R and 710L may be opaque, such that the user may be immersed in the VR imagery based on computer-generated images.

The right-eye and left-eye display systems 710R and 710L may include image display components configured to project computer-generated virtual images into left and right display windows 715L and 715R in a field of view ("FOV"). The right-eye and left-eye display systems 710R and 710L may be any suitable display systems. In some embodiments, the right-eye and left-eye display systems 710R and 710L may include one or more display devices disclosed herein. For illustrative purposes, FIG. 7A shows that the right-eye and left-eye display systems 710R and 710L may include a projector 735 coupled to the frame 705. The projector 735 may generate an image light representing a virtual image. The projector 735 may include one or more display devices disclosed herein.

As shown in FIG. 7B, the NED 700 may also include a lens system (or viewing optical system) 785 and an object tracking system 750 (e.g., eye tracking system and/or face tracking system). The lens system 785 may be disposed between the object tracking system 750 and the left-eye display system 710L. The lens system 785 may be configured to guide the image light output from the left-eye display system 710L to an exit pupil 760. The exit pupil 760 may be a location where an eye pupil 755 of an eye 765 of the user is positioned in an eye-box region 730 of the left-eye display system 710L. In some embodiments, the lens system 785 may be configured to correct aberrations in the image light output from the left-eye display system 710L, magnify the image light output from the left-eye display system 710L, or perform another type of optical adjustment to the image light output from the left-eye display system 710L. The lens system 785 may include multiple optical elements, such as lenses, waveplates, reflectors, etc. In some embodiments, the lens system 785 may include a pancake lens assembly configured to fold the optical path, thereby reducing the back focal distance in the NED 700. The pancake lens assembly may be any embodiment of the pancake lens assemblies disclosed herein, such as the pancake lens assembly 601 shown in FIG. 6A. The object tracking system 750 may include an IR light source 751 configured to illuminate the eye 765 and/or the face, a deflecting element 752 configured to deflect the IR light reflected by the eye 765, and an optical sensor 753 configured to receive the IR light deflected by the deflecting element 752 and generate a tracking signal.

In some embodiments, the present disclosure may provide a device including a light source configured to emit a first light associated with a first predetermined wavelength band. The device may also include an optical stack including a reflective polarizer, a color conversion layer, and a color filter array, the optical stack configured to convert the first light associated with the first predetermined wavelength band into a second light associated with a second predetermined wavelength band. The second light associated with the second predetermined wavelength band may be a polarized light with a predetermined polarization.

In some embodiments, the device may include a linear polarizer, wherein the optical stack is disposed between the linear polarizer and the light source. In some embodiments, the device may include a reflector, wherein the light source is disposed between the optical stack and the reflector. In some embodiments, in the optical stack, the color conversion layer may be disposed between reflective polarizer and the color filter array.

In some embodiments, the device may include a waveplate and a reflector. The waveplate may be disposed between the reflective polarizer and the color conversion layer, and the light source may be disposed between the reflective polarizer and the reflector.

In some embodiments, the reflective polarizer may be configured to transmit a first portion of the first light associated with the first wavelength band. The waveplate may be configured to convert a first polarization of the first portion of the first light into a second polarization. The color conversion layer may be configured to convert the first portion of the first light associated with the first wavelength band into a first portion of the second light associated with the second wavelength band. The color filter array may be configured to transmit the first portion of the second light associated with the second wavelength hand.

In some embodiments, the reflective polarizer may be configured to reflect a second portion of the first light toward the reflector. The reflector may be configured to reflect the second portion of the first light toward the reflective polarizer, and change a polarization of the second portion of the first light into the first polarization. The reflective polarizer may be further configured to transmit the second portion of the first light having the first polarization. The waveplate may be configured to convert the first polarization of the second portion of the first light into the second polarization. The color conversion layer may be configured to convert the second portion of the first light into a second portion of the second light associated with the second predetermined wavelength band.

In some embodiments, the device may also include a linear polarizer. The linear polarizer may be configured to convert an unpolarized ambient light into a polarized ambient light having the second polarization. The color filter array may be configured to transmit a first portion of the polarized ambient light associated with the second predetermined wavelength band, and block remaining portions of the polarized ambient light associated with wavelength bands other than the second predetermined wavelength band. The color conversion layer may be configured to transmit the first portion of the polarized ambient light output from the color filter array. The waveplate may be configured to convert the second polarization of the first portion of the polarized ambient light into the first polarization. The reflective polarizer may be configured to transmit the first portion of the polarized ambient light having the first polarization output from the waveplate. The reflector may be configured to reflect the first portion of the polarized ambient light and change the first polarization into a third polarization. The reflective polarizer may be configured to transmit the first portion of the polarized ambient light having the third polarization. The waveplate may be configured to convert the third polarization of the first portion of the polarized ambient light into a fourth polarization. The color conversion layer may be configured to transmit the first portion of the polarized ambient light having the fourth polarization. The color filter array may be configured to transmit the first portion of the polarized ambient light having the fourth polarization. The linear polarizer may be configured to absorb the first portion of the polarized ambient light having the fourth polarization.

In some embodiments, the device may also include a waveplate and a reflector. The waveplate may be disposed between the reflective polarizer and the light source, and the light source may be disposed between the waveplate and the reflector.

In some embodiments, the reflective polarizer may be configured to transmit a first portion of the first light associated with the first predetermined wavelength band, the first portion of the first light having a first polarization. The color conversion layer may be configured to convert the first portion of the first light associated with the first predetermined wavelength band into a first portion of the second light associated with the second predetermined wavelength band. The color filter array may be configured to transmit the first portion of the second light.

In some embodiments, the reflective polarizer may be configured to reflect a second portion of the first light toward the waveplate and the reflector, the second portion of the first light having a second polarization. The waveplate may be configured to convert the second polarization of the second portion of the first light into a third polarization. The reflector may be configured to reflect the second portion of the first light having the third polarization as the second portion of the first light having a fourth polarization. The waveplate may be configured to convert the fourth polarization of the second portion of the first light into the first polarization. The reflective polarizer may be configured to transmit the second portion of the first light having the first polarization. The color conversion layer may be configured to convert the second portion of the first light associated with the first predetermined wavelength band into a second portion of the second light associated with the second predetermined wavelength band.

In some embodiments, the device may include a linear polarizer. The linear polarizer may be configured to convert an unpolarized ambient light into a polarized ambient light having the first polarization. The color filter array may be configured to transmit a first portion of the polarized ambient light associated with the second predetermined wavelength band, and block remaining portions of the polarized ambient light associated with wavelength bands other than the second predetermined wavelength band. The color conversion layer may be configured to transmit the first portion of the polarized ambient light output from the color filter array. The reflective polarizer may be configured to transmit the first portion of the polarized ambient light output from the color filter array. The waveplate may be configured to convert the first polarization of the first portion of the polarized ambient light into the fourth polarization. The reflector may be configured to reflect the first portion of the polarized ambient light output from the waveplate, and change the fourth polarization to the third polarization. The waveplate may be configured to convert the third polarization of the first portion of the polarized ambient light reflected by the reflector into the second polarization. The reflective polarizer may be configured to transmit the first portion of the polarized ambient light having the second polarization that is output from the waveplate. The color conversion layer may be configured to transmit the first portion of the polarized ambient light output from the reflective polarizer. The color filter array may be configured to transmit the first portion of the polarized ambient light output from color conversion layer. The linear polarizer may be configured to absorb the first portion of the polarized ambient light output from the color filter array.

In some embodiments, the device may include a waveplate and a reflector. The waveplate may be disposed between the light source and the reflector, and the light source may be disposed between the waveplate and the reflective polarizer.

In some embodiments, the reflective polarizer may be configured to transmit a first portion of the first light associated with the first predetermined wavelength band, the first portion of the first light having a first polarization. In some embodiments, the color conversion layer may be configured to convert the first portion of the first light associated with the first predetermined wavelength band into a first portion of the second light associated with the second predetermined wavelength band. In some embodiments, the color filter array may be configured to transmit the first portion of the second light.

In some embodiments, the reflective polarizer may be configured to reflect a second portion of the first light toward the waveplate and the reflector, the second portion of the first light having a second polarization. The waveplate may be configured to convert the second polarization of the second portion of the first light into a third polarization. The reflector may be configured to reflect the second portion of the first light having the third polarization as the second portion of the first light having a fourth polarization. The waveplate may be configured to convert the fourth polarization of the second portion of the first light into the first polarization. The reflective polarizer may be configured to transmit the second portion of the first light having the first polarization. The color conversion layer may be configured to convert the second portion of the first light associated with the first predetermined wavelength band into a second portion of the second light associated with the second predetermined wavelength band.

In some embodiments, the device may include a linear polarizer. The linear polarizer may be configured to convert an unpolarized ambient light into a polarized ambient light having the first polarization. The color filter array may be configured to transmit a first portion of the polarized ambient light associated with the second predetermined wavelength band, and block remaining portions of the polarized ambient light associated with wavelength bands other than the second predetermined wavelength band. The color conversion layer may be configured to transmit the first portion of the polarized ambient light output from the color filter array. The reflective polarizer may be configured to transmit the first portion of the polarized ambient light output from the color filter array. The waveplate may be configured to convert the first polarization of the first portion of the polarized ambient light into the fourth polarization. The reflector may be configured to reflect the first portion of the polarized ambient light output from the waveplate, and change the fourth polarization to the third polarization. The waveplate may be configured to convert the third polarization of the first portion of the polarized ambient light reflected by the reflector into the second polarization. The reflective polarizer may be configured to transmit the first portion of the polarized ambient light having the second polarization that is output from the waveplate. The color conversion layer may be configured to transmit the first portion of the polarized ambient light output from the reflective polarizer. The color filter array may be configured to transmit the first portion of the polarized ambient light output from color conversion layer. The linear polarizer may be configured to absorb the first portion of the polarized ambient light output from the color filter array.

In some embodiments, in the optical stack, the reflective polarizer may be disposed between the color conversion layer and the color filter array. In some embodiments, the device may include a waveplate and a reflector. The waveplate may be disposed between the light source and the color conversion layer, and the light source may be disposed between the waveplate and the reflector.

In some embodiments, the color conversion layer may be configured convert a first portion of the first light associated with the first predetermined wavelength band into a first portion of the second light associated with the second predetermined wavelength band. The reflective polarizer may be configured to transmit the first portion of the second light. The color filter array may be configured to transmit the first portion of the second light. The color conversion layer may be configured to transmit a second portion of the first light associated with the first predetermined wavelength band. The reflective polarizer may be configured to reflect the second portion of the first light having a first polarization. The color conversion layer may be configured to transmit the second portion of the first light having the first polarization output from the reflective polarizer. The waveplate may be configured to convert the first polarization of the second portion of the first light into a second polarization. The reflector may be configured to reflect the second portion of the first light and change the second polarization to a third polarization. The waveplate may be configured to convert the third polarization of the second portion of the first light output from the reflector into a fourth polarization. The color conversion layer may be configured to convert the second portion of the first light associated with the first predetermined wavelength band into a second portion of the second light associated with the second predetermined wavelength band. The color filter array may be configured to transmit the second portion of the second light. In some embodiments, the device may include a waveplate and a reflector. The light source may be disposed between the waveplate and the color conversion layer, and the waveplate may be disposed between the light source and the reflector.

Any of the steps, operations, or processes described herein may be performed or implemented with one or more hardware and/or software modules, alone or in combination with other devices. In one embodiment, a software module is implemented with a computer program product including a computer-readable medium containing computer program code, which can be executed by a computer processor for performing any or all of the steps, operations, or processes described. In some embodiments, a hardware module may include hardware components such as a device, a system, an optical element, a controller, an electrical circuit, a logic gate, etc.

Further, when an embodiment illustrated in a drawing shows a single element, it is understood that the embodiment or another embodiment not shown in the figures but within the scope of the present disclosure may include a plurality of such elements. Likewise, when an embodiment illustrated in a drawing shows a plurality of such elements, it is understood that the embodiment or another embodiment not shown in the figures but within the scope of the present disclosure may include only one such element. The number of elements illustrated in the drawing is for illustration purposes only, and should not be construed as limiting the scope of the embodiment. Moreover, unless otherwise noted, the embodiments shown in the drawings are not mutually exclusive, and they may be combined in any suitable manner. For example, elements shown in one figure/embodiment but not shown in another figure/embodiment may nevertheless be included in the other figure/embodiment. In any optical device disclosed herein including one or more optical layers, films, plates, or elements, the numbers of the layers, films, plates, or elements shown in the figures are for illustrative purposes only. In other embodiments not shown in the figures, which are still within the scope of the present disclosure, the same or different layers, films, plates, or elements shown in the same or different figures/embodiments may be combined or repeated in various manners to form a stack.

Various embodiments have been described to illustrate the exemplary implementations. Based on the disclosed embodiments, a person having ordinary skills in the art may make various other changes, modifications, rearrangements, and substitutions without departing from the scope of the present disclosure. Thus, while the present disclosure has been described in detail with reference to the above embodiments, the present disclosure is not limited to the above described embodiments. The present disclosure may be embodied in other equivalent forms without departing from the scope of the present disclosure. The scope of the present disclosure is defined in the appended claims.

What is claimed is:

1. A display, comprising:
   a plurality of light-emitting elements configured to emit a first light associated with a first predetermined wavelength band; and
   an optical assembly including a reflective polarizer, a color conversion layer, and a color filter layer, the optical assembly configured to at least partially convert the first light associated with the first predetermined wavelength band into a second light associated with a second predetermined wavelength band, the second light being a polarized light of a predetermined polarization,
   wherein the reflective polarizer is configured to selectively reflect or transmit a light depending on a polarization of the light when the light is associated with the first predetermined wavelength band, and transmit the light independent of the polarization of the light when the light is associated with a wavelength band outside of the first predetermined wavelength band.

2. The display of claim 1, wherein the color conversion layer is configured to substantially maintain a polarization of a light while converting the light from being associated with the first predetermined wavelength band to being associated with the second predetermined wavelength band.

3. The display of claim 1, wherein the color conversion layer includes at least one of nanocrystals, organic molecules, or organic dyes aligned in a predetermined direction.

4. The display of claim 1, wherein the color conversion layer includes at least one of quantum rods or semiconductor nanoplatelets aligned in a predetermined direction.

5. The display of claim 1, wherein the reflective polarizer is a patterned reflective polarizer.

6. The display of claim 5, wherein the first predetermined wavelength band is a blue wavelength band, and the display includes a first subpixel associated with the first predetermined wavelength band and a second subpixel associated with the second predetermined wavelength band.

7. The display of claim 6, wherein
   the reflective polarizer includes a first polarizer unit corresponding to the first subpixel and a second polarizer unit corresponding to the second subpixel, and
   the second polarizer unit includes a sub-reflective polarizer, and the first polarizer unit does not include a sub-reflective polarizer.

8. The display of claim 6, wherein
   the color conversion layer includes a first color conversion unit corresponding to the first subpixel and a second color conversion unit corresponding to the second subpixel,
   the second color conversion unit includes a color conversion material configured to absorb the first light associated with the first predetermined wavelength band and emit the second light associated with the second predetermined wavelength band, and
   the first color conversion unit is configured to transmit the first light associated with the first predetermined wavelength band without changing the first predetermined wavelength band.

9. The display of claim 1, wherein
the color filter layer includes a first color filter configured to transmit the first light associated with the first predetermined wavelength band and absorb the second light associated with the second predetermined wavelength band, and a second color filter configured to transmit the second light associated with the second predetermined wavelength band and absorb the first light associated with the first predetermined wavelength band.

10. The display of claim 1, wherein the first predetermined wavelength band is an ultraviolet ("UV") wavelength band, and the reflective polarizer is a uniform reflective polarizer with a designed operating wavelength band within or corresponding to the UV wavelength band.

11. The display of claim 1, further comprising a linear polarizer, wherein the optical assembly is disposed between the linear polarizer and the light-emitting elements.

12. The display of claim 11, wherein the color filter layer is disposed between the linear polarizer and the color conversion layer.

13. The display of claim 1, further comprising a reflector, wherein the light-emitting elements are disposed between the optical assembly and the reflector.

14. The display of claim 1, wherein the light-emitting elements include a reflector, and the reflector and the optical assembly are disposed at different sides of the light-emitting elements.

15. The display of claim 1, wherein in the optical assembly, the color conversion layer is disposed between the reflective polarizer and the color filter layer.

16. The display of claim 1, wherein in the optical assembly, the reflective polarizer is disposed between the color conversion layer and the color filter layer.

17. The display of claim 1, wherein the optical assembly further includes a waveplate disposed between the reflective polarizer and the color conversion layer.

18. The display of claim 1, further comprising a waveplate disposed between the optical assembly and the light-emitting elements.

19. The display of claim 1, further comprising a waveplate, wherein the waveplate and the optical assembly are disposed at different sides of the light-emitting elements.

* * * * *